(12) United States Patent
Miyamoto

(10) Patent No.: US 8,445,183 B2
(45) Date of Patent: May 21, 2013

(54) METHOD OF MANUFACTURING SEMICONDUCTOR DEVICE AND PATTERN FORMATION METHOD

(75) Inventor: Hiroyuki Miyamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 215 days.

(21) Appl. No.: 12/826,163

(22) Filed: Jun. 29, 2010

(65) Prior Publication Data

US 2011/0003253 A1 Jan. 6, 2011

(30) Foreign Application Priority Data

Jul. 6, 2009 (JP) ................... 2009-159905

(51) Int. Cl.
*G03F 7/26* (2006.01)
(52) U.S. Cl.
USPC ............ 430/313; 430/328; 430/330
(58) Field of Classification Search ......... 430/311, 430/313, 314, 322, 328, 330
See application file for complete search history.

(56) References Cited

U.S. PATENT DOCUMENTS

| | | | | |
|---|---|---|---|---|
| 5,667,940 | A * | 9/1997 | Hsue et al. | 430/312 |
| 2006/0014348 | A1* | 1/2006 | Wu | 438/262 |
| 2009/0011370 | A1* | 1/2009 | Nakamura et al. | 430/322 |
| 2009/0253080 | A1* | 10/2009 | Dammel et al. | 430/324 |

FOREIGN PATENT DOCUMENTS

| | | |
|---|---|---|
| JP | 2007-310086 | 11/2007 |
| JP | 2008-257170 | 10/2008 |
| JP | 2008-281825 | 11/2008 |
| JP | 2009-015194 | 1/2009 |

OTHER PUBLICATIONS

Seraphim, ed. "Principles of Electronic Packaging", 1989, McGraw-Hill, pp. 374-376.*
Jo Finders et al.; Double patterning for 32nm and below: an update; Proc. of SPIE; vol. 6924, 692408-1; 2008.
Mircea Dusa et al.; Pitch Doubling Through Dual Patterning Lithography Challenges in Integration and Litho Budgets; Proc. of SPIE; vol. 6520, 65200G-1; 2007.
Sungkoo Lee et al.; Double exposure technology using silicon containing materials; Proc. of SPIE; vol. 6153 61531K-1; 2006.

* cited by examiner

*Primary Examiner* — Kathleen Duda
(74) *Attorney, Agent, or Firm* — Dentons US LLP

(57) ABSTRACT

A method of manufacturing a semiconductor device, includes: a first resist film formation process of forming a first resist film on a processing target surface using a positive-type photoresist material; a first resist pattern formation process of forming a first resist pattern by performing development after exposure in which light is irradiated onto the first resist film; a second resist film formation process of forming a second resist film on the processing target surface, where the first resist pattern is formed, using a photoresist material; and a second resist pattern formation process of forming a second resist pattern by performing exposure in which light is irradiated onto the second resist film and then performing development. The method further includes an insolubilization process for insolubilizing the first resist pattern against a developer and a solvent of a photoresist material used in the second resist pattern formation process.

14 Claims, 24 Drawing Sheets

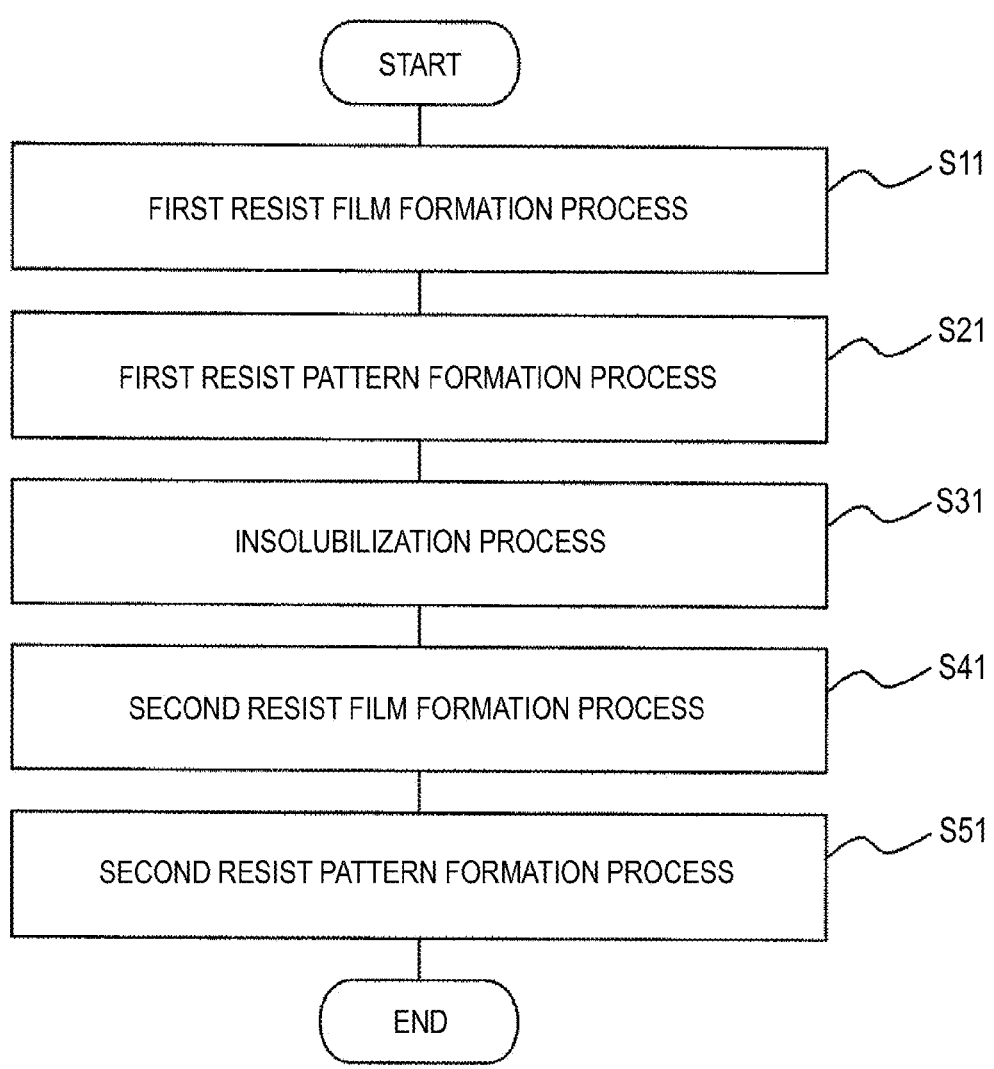

HEAT TREATMENT

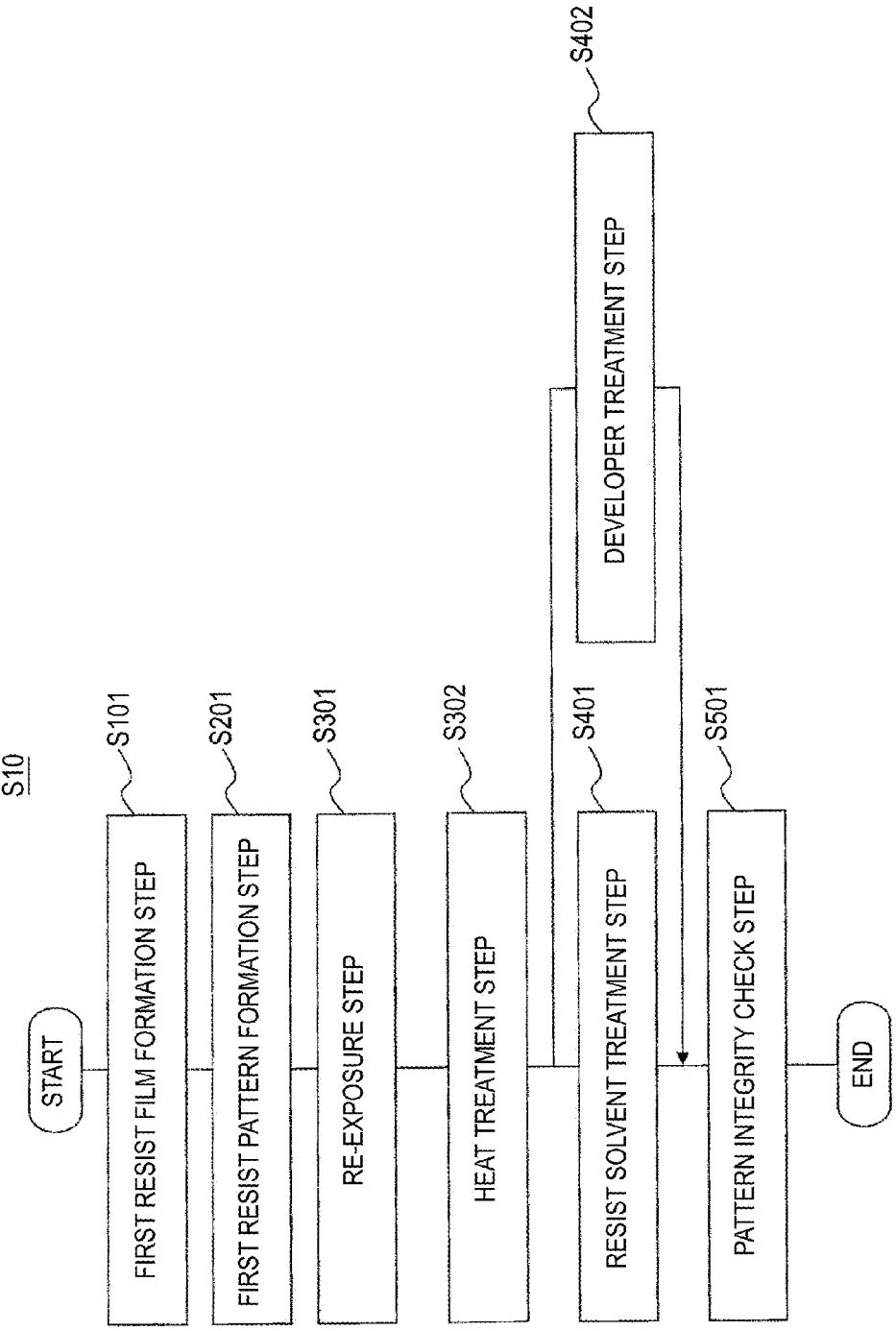

FIG.23

<VARIATION IN INSOLUBILITY FOR HEAT TREATMENT TEMPERATURE>

※ AN EXPOSURE AMOUNT OF RE-EXPOSURE IS SET TO A CONSTANT CONDITION OF 700 J/m²

| | | HEAT TREATMENT TEMPERATURE AFTER RE-EXPOSURE | | | | |
|---|---|---|---|---|---|---|
| | | NO | 120°C | 150°C | 180°C | 200°C |
| NO RE-EXPOSURE | INSOLUBILITY AFTER ALKALI DEVELOPER TREATMENT | ○ | ○ | ○ | × | × |
| | INSOLUBILITY AFTER RESIST SOLVENT TREATMENT | × | × | × | × | × |
| RE-EXPOSURE (700 J/m²) | INSOLUBILITY AFTER ALKALI DEVELOPER TREATMENT | ○ | × | ○ | ○ | ○ |
| | INSOLUBILITY AFTER RESIST SOLVENT TREATMENT | × | × | × | ○ | ○ |

FIG.24

<VARIATION IN INSOLUBILITY FOR EXPOSURE AMOUNT OF RE-EXPOSURE>

※ A HEAT TREATMENT TEMPERATURE AFTER RE-EXPOSURE IS SET TO A CONSTANT CONDITION OF 180°C/120sec.

| (J/m²) | 200 | 300 | 400 | 500 | 600 | 700 | 800 | 900 | 1000 |
|---|---|---|---|---|---|---|---|---|---|
| INSOLUBILITY AFTER ALKALI DEVELOPER TREATMENT | × | × | × | × | ○ | ○ | ○ | ○ | ○ |
| INSOLUBILITY AFTER RESIST SOLVENT TREATMENT | × | × | × | × | ○ | ○ | ○ | ○ | ○ |

METHOD OF MANUFACTURING SEMICONDUCTOR DEVICE AND PATTERN FORMATION METHOD

BACKGROUND OF THE INVENTION

1. Field of the Invention

The present invention relates to a method of manufacturing a semiconductor device and a method of forming a pattern. Particularly, the present invention relates to a method of manufacturing a semiconductor device and a method of forming a pattern using a double-patterning method.

2. Description of the Related Art

In order to manufacture the semiconductor device, a fine fabrication process is performed by forming fine patterns or the like using a lithography technology.

In the aforementioned process, first, a resist film made of a photosensitive material is formed on the surface as a target of the micro-fabrication process. Then, a pattern image is transferred to the resist film by performing exposure. Subsequently, development is performed for the resist film where the pattern image is transferred to form a resist pattern from the resist film. In addition, a micro-patterning is performed, for example, by performing etching using the resist pattern as a mask.

In addition, ion implantation for implanting impurities onto the semiconductor layer and the like are performed using the aforementioned resist pattern as a mask.

In this process, the resist film is formed using a negative-type or positive-type resist material. For the negative-type resist material, a portion where the pattern image is transferred to the resist film is insolubilized against a developer. For the positive-type resist material, a portion where the pattern image is transferred to the resist film is solubilized to a developer.

In order to further miniaturize the semiconductor device, a double-patterning method was proposed (e.g., refer to Sungkoo Lee et al., "Double exposure technology using silicon containing materials," SPIE2006 Vol. 6153 61531K-7 (2006), Mircea Dusa et al., "Pitch Doubling Through Dual Patterning Lithography Challenges in Integration and Litho Budgets," SPIE2007 Vol. 6520 65200G-2 (2007), and Jo Finders et al., "Double patterning for 32 nm and below: an update," SPIE2008 Vol. 6924 692408-12 (2008)).

In the double-patterning method, the resist pattern is formed by dividing into a plurality of layers, and a plurality of resist patterns are used as a mask during other processes such as etching.

For example, in the double-patterning method, a first layer of the resist pattern is formed with the same interval, and then, a processing target layer is patterned by performing an etching process using that resist pattern as a mask. Then, a second layer of the resist pattern is formed with the same interval such that the first layer of the resist pattern is shifted by a half cycle. Furthermore, etching is performed using that resist pattern as a mask. As a result, the pattern can be finely formed in an appropriate manner compared to a single patterning process.

In addition, a method of laminating a plurality of resist patterns was also proposed.

However, in this case, in order to form an overlying resist pattern on an underlying resist pattern, the underlying resist pattern may be dissolved by the solvent contained in the overlying resist material. In addition, the underlying resist pattern may be dissolved by the developer used to develop the overlying resist pattern. Therefore, it may be difficult to form the patterns with high accuracy.

In order to address such difficulties, a method of insolubilizing the underlying resist pattern before forming the overlying resist pattern was proposed (e.g., refer to JP-A-2007-310086, JP-A-2008-257170, JP-A-2009-015194, and JP-A-2008-281825.

SUMMARY OF THE INVENTION

However, in the aforementioned insolubilization, since dedicated materials or equipment are demanded, cost may disadvantageously increase.

As a method of curing the resist pattern, processes such as UV-curing or plasma exposure are known in the art. However, in these methods, the shape of the resist pattern may be deformed by heat shearing. Since it is difficult to process the entire surface of a wafer with a constant condition, or a plurality of resist patterns are laminated, it may be difficult to obtain a demanded insolubilization capability.

Specifically, in the UV-curing, since broadband light is irradiated from the Hg lamp light source, it is difficult to obtain sufficient insolubility of the resist pattern against a resist solvent or a developer. In addition, due to the broadband light, a film temperature may increase by optical absorption, and the pattern may be deformed. In addition, some disadvantages such as generation of a discharge gas or necessity of dedicated equipment are generated.

Therefore, it may be difficult to manufacture a semiconductor device with high efficiency or realize cost reduction.

Accordingly, it is desirable to provide a method of manufacturing a semiconductor device and a pattern formation method by which manufacturing efficiency can be improved, and cost reduction can be readily realized.

According to an embodiment of the present invention, there is provided a method of manufacturing a semiconductor device, the method including: a first resist film formation process of forming a first resist film on a processing target surface using a positive-type photoresist material; a first resist pattern formation process of forming a first resist pattern by performing development after exposure in which exposure light is irradiated onto the first resist film; a second resist film formation process of forming a second resist film on the processing target surface, where the first resist pattern is formed, using a photoresist material; and a second resist pattern formation process of forming a second resist pattern by performing exposure in which exposure light is irradiated onto the second resist film and then performing development, wherein, the method further includes, before the second resist film formation process, an insolubilization process for insolubilizing the first resist pattern against a developer used in development of the second resist film formation process and a solvent of a photoresist material used in the second resist pattern formation process, and in the insolubilization process, insolubilization of the first resist pattern is performed by sequentially performing a re-exposure step of performing re-exposure in which light having the same wavelength as that of exposure light irradiated in the exposure of the first resist pattern formation process is irradiated onto the first resist pattern and a heat treatment step of performing heat treatment to heat the first resist pattern subjected to the re-exposure process.

According to another embodiment of the present invention, there is provided a method of manufacturing a semiconductor device, the method including: a resist film formation process of forming a resist film on a processing target surface using a positive-type photoresist material; a resist pattern formation process of forming a resist pattern by performing development after exposure in which exposure light is irradiated onto the resist film; an insolubilization process of performing insolubilization to insolubilize a part of the resist pattern; and a resist pattern selective removal process in which a part of the resist pattern subjected to the insolubilization remains, and other portions are removed, wherein in the insolubilization process, insolubilization is performed to insolubilize apart of the resist pattern against the solvent used in the resist pattern selective removal process by sequentially performing a re-exposure step of performing re-exposure in which light having the same wavelength as that of the exposure light irradiated in the exposure of the resist pattern formation process is irradiated onto a part of the resist pattern, and a heat treatment step of performing heat treatment to heat the resist pattern subjected to the re-exposure, and in the resist pattern selective removal process, a portion of the resist pattern subjected to the re-exposure remains, and a portion where the re-exposure is not performed is removed.

According to still another embodiment of the present invention, there is provided a pattern formation method including: a first resist film formation process of forming a first resist film on a processing target surface using a positive-type photoresist material; a first resist pattern formation process of forming a first resist pattern by performing exposure in which exposure light is irradiated onto the first resist film and then performing development; a second resist film formation process of forming a second resist film on a processing target surface, where the first resist pattern is formed, using a photoresist material; and a second resist pattern formation process of forming a second resist pattern by performing exposure in which exposure light is irradiated onto the second resist film and then performing development, wherein the pattern formation method further includes an insolubilization process of insolubilizing the first resist pattern against a developer used in development of the second resist pattern formation process and a solvent of the photoresist material used in the second resist film formation process before the second resist film formation process, and in the insolubilization process, insolubilization for the first resist pattern is performed by sequentially performing a re-exposure step of performing re-exposure in which light having the same wavelength as that of the exposure light irradiated in the exposure of the first resist pattern formation process is irradiated onto the first resist pattern and a heat treatment step of performing heat treatment to heat the first resist pattern subjected to the re-exposure.

According to yet another embodiment of the present invention, there is provided a pattern formation method including: a resist film formation process of forming a resist film on a processing target surface using a positive-type photoresist material; a resist pattern formation process of forming a resist pattern by performing exposure in which exposure light is irradiated onto the resist film and then performing development; an insolubilization process of performing insolubilization to insolubilize a part of the resist pattern; and a resist pattern selective removal process in which a part of the resist pattern subjected to insolubilization remains, and other portions are removed, wherein in the insolubilization process, insolubilization is performed to insolubilize the resist pattern against a solvent used in the resist pattern selective removal process by sequentially performing a re-exposure step in which light having the same wavelength as that of the exposure light irradiated in the exposure of the resist pattern formation process is irradiated onto a part of the resist pattern, and a heat treatment step of performing heat treatment to heat the resist pattern subjected to the re-exposure, and wherein in the resist pattern selective removal process, a portion of the resist pattern subjected to the re-exposure remains, and a portion where the re-exposure is not performed is removed.

In the insolubilization process according to the embodiment of the present invention, a re-exposure process is performed such that light having the same wavelength as that of the exposure light irradiated in the exposure of the resist pattern formation process is irradiated onto the resist pattern. In addition, heat treatment is performed to heat the resist pattern subjected to the re-exposure process. As a result, insolubilization is performed for the resist pattern.

According to the embodiments of the present invention, it is possible to provide a method of manufacturing a semiconductor device and a pattern formation method capable of improving manufacturing efficiency and readily realizing cost reduction.

BRIEF DESCRIPTION OF THE DRAWINGS

FIG. 1 illustrates a method of manufacturing a semiconductor device according to a first embodiment of the present invention.

FIG. 22 is a flowchart illustrating a process (S10) of setting an insolubilization condition according to the fourth embodiment of the present invention.

FIG. 23 illustrates a result of examining pattern integrity according to the fourth embodiment of the present invention.

FIG. 24 illustrates a result of examining pattern integrity according to the fourth embodiment of the present invention.

DESCRIPTION OF THE PREFERRED EMBODIMENTS

Hereinafter, embodiments of the present invention will be described with reference to the accompanying drawings.

Descriptions will be made in the following sequence.

1. First Embodiment
2. Second Embodiment (when ion implantation is performed after insolubilization)
3. Third Embodiment (when a part of the pattern is selectively removed)
4. Fourth Embodiment (when an insolubilization condition is previously set)<
<1. First Embodiment>
(A) Manufacturing Method Main components of a method of manufacturing a semiconductor device will be described.

FIGS. 1 and 2A to 9B illustrate a method of manufacturing a semiconductor device according to the first embodiment of the present invention.

Here, FIG. 1 is a flowchart illustrating a method of manufacturing a semiconductor device according to the present embodiment.

FIGS. 2A to 9B illustrate each process of manufacturing a semiconductor device according to the first embodiment of the invention. FIGS. 2A, 3A, 4A, 5A, 6A, 7A, 8A, and 9A are cross-sectional views, and FIGS. 2B, 3B, 4B, 5B, 6B, 7B, 8B, and 9B are top plan views. FIGS. 2A, 3A, 4A, 5A, 6A, 7A, 8A, and 9A illustrate cross-sections along the lines XA1-XA2 of FIGS. 2B, 3B, 4B, 5B, 6B, 7B, 8B, and 9B, respectively.

(A-1) First Resist Film Formation Process (S11)

First, as shown in FIG. 1, a first resist film formation process is performed (S11).

Figure 2A:
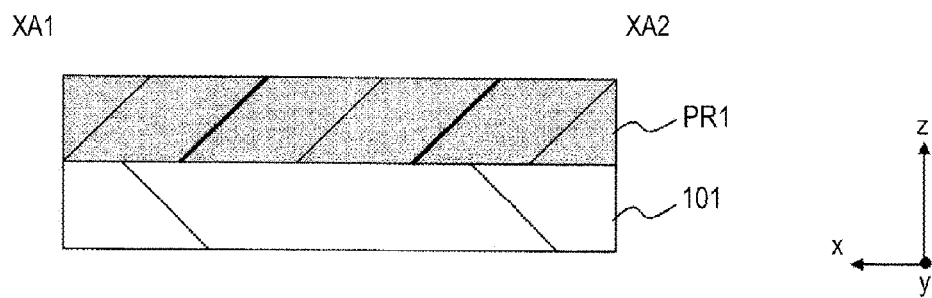
FIGS. 2A and 2B illustrate a method of manufacturing a semiconductor device according to the first embodiment of the present invention.
Figure 2B:
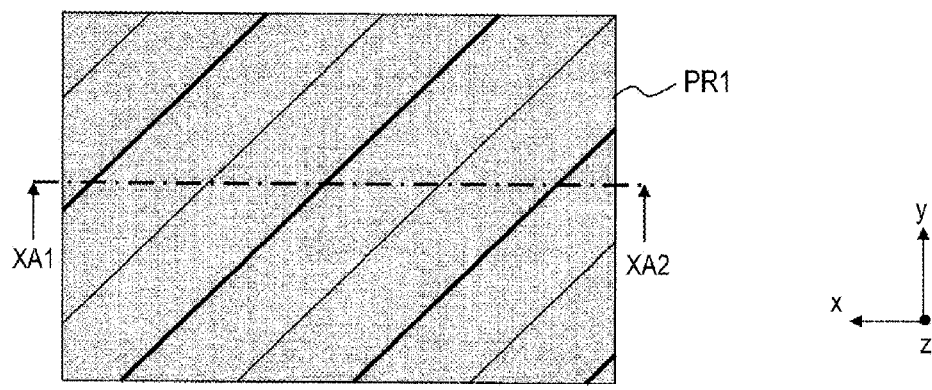

Here, as shown in FIGS. 2A and 2B, the first resist film PR1 is formed.

Specifically, as shown in FIG. 2A, the first resist film PR1 is formed on the surface of the substrate 101. In addition, as shown in FIG. 2B, the first resist film PR1 is formed to cover the entire surface of the substrate 101.

When a process of forming the first resist film PR1 is performed, a positive-type chemical amplification resist material is used as a photoresist material. The first resist film PR1 is formed to have a film thickness of, for example, 500 nm.

For example, a coating solution having the following composition is coated on the surface of the substrate 101 according to a spin coat method.

[Composition of Coating Solution]
photoresist material: 248 nm exposure KrF chemical amplification positive resist, which contains polymer and is structured of polystyrene (Product Name AZ DX6270P, manufactured by AZ Electronic Material Co., Ltd.)
resist solvent: mixed solvent containing propylene glycol monomethyl ether (PGME) of 30 wt % and propylene glycol monomethyl ether acetate (PGMEA) of 70 wt %

After the coating, heat treatment is performed, for example, under the following condition, and the first resist film PR1 is formed as follows.

[Heat Treatment Condition]
heating temperature: 120° C.
heating time: 90 seconds (A-2) First Resist Pattern Formation Process (S21)

Next, as shown in FIG. 1, the first resist pattern formation process is performed (S21).

Here, the first resist pattern PM1 is formed through each step shown in FIGS. 3A, 3B, 4A, and 4B.

Figure 3A:
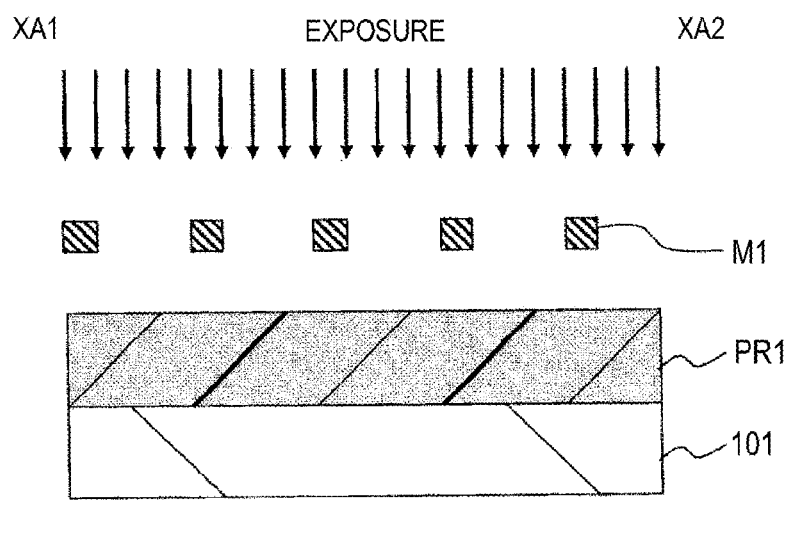
FIGS. 3A and 3B illustrate a method of manufacturing a semiconductor device according to the first embodiment of the present invention.
Figure 3B:
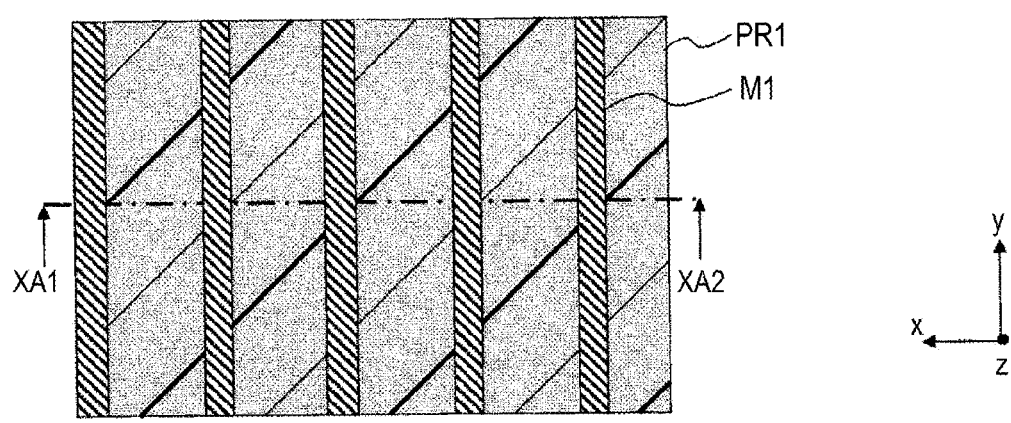

First, as shown in FIGS. 3A and 3B, exposure for transferring a pattern image to the first resist film PR1 is performed using a photomask M1 having a mask pattern.

In the exposure, light which is irradiated from a KrF excimer laser and has a waveform of 248 nm is used as the exposure light. As described above, the first resist film PR1 is formed using a positive-type resist material by which unexposed portions remain after the development. For this reason, in order to perform the exposure, a photomask M1 patterned such that the exposure light is not irradiated onto a portion where the first resist pattern PM1 is formed, but is irradiated onto other portions is used for the first resist film PR1.

The exposure is performed, for example, under the following condition.

[Exposure Condition]
exposure amount: 280 J/m$^2$

After exposure is performed for the first resist film PR1, heat treatment and development are performed for the first resist film PR1. As a result, the first resist pattern PM1 is formed as shown in FIGS. 4A and 4B.

Figure 4A:
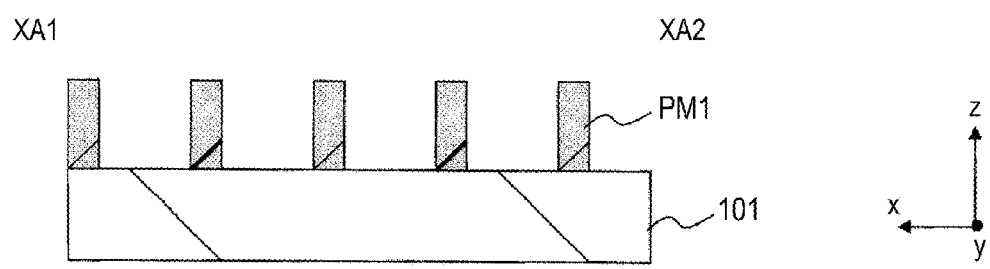
FIGS. 4A and 4B illustrate a method of manufacturing a semiconductor device according to the first embodiment of the present invention.
Figure 4B:
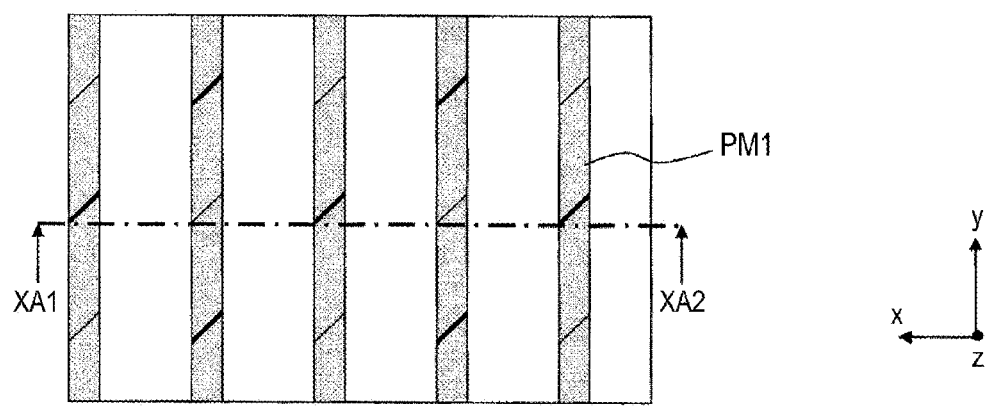

Specifically, as shown in FIG. 4A, the first resist pattern PM1 is formed on the surface of the substrate 101 such that a rectangular cross-sectional pattern having a convex shape is upwardly protruded in the z-direction. In addition, as shown in FIG. 4B, the first resist pattern PM1 is formed such that a plurality of patterns extending in a longitudinal direction (y) is lined with the same interval in a lateral direction (x).

The heat treatment in this process is a so-called PEB (Post Exposure Bake) process and is performed, for example, under the following condition. As a result, generation of acid based on the catalytic reaction in the chemical amplification resist can be accelerated.

[Heat Treatment (PEB Process) Condition]
heating temperature: 130° C.
heating time: 90 seconds In addition, development in this process is performed, for example, under the following condition.

[Development Condition]
alkali developer: tetra methyl ammonium hydroxide (TMAH) aqueous solution of 2.38 wt %
development time: 60 seconds (A-3) Insolubilization Process (S31)

Next, as shown in FIG. 1, an insolubilization process is performed (S31).

Here, an insolubilization process is performed for the first resist pattern PM1 through the steps shown in FIGS. 5A, 5B, 6A, and 6B.

In the insolubilization process, the first resist pattern PM1 is insolubilized such that the first resist pattern P1M is insolubilized against a solvent of the photoresist material used in the second resist film formation process (S41) which is described below. In addition, the first resist pattern PM1 is insolubilized such that the first resist pattern PM1 is insolubilized against a developer used in the development of the second resist pattern formation process (S51) which is described below. In other words, this process is performed such that the first resist pattern PM1 is insolubilized against not the state before the insolubilization process but the liquid used in the subsequent processes.

Figure 5A:
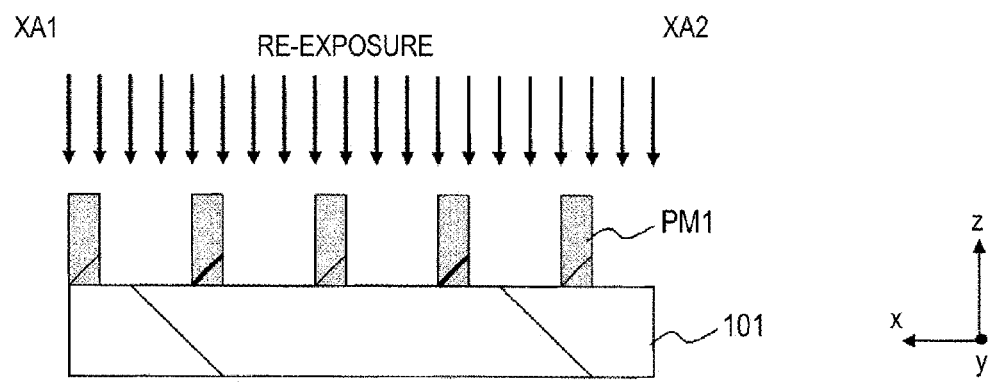
FIGS. 5A and 5B illustrate a method of manufacturing a semiconductor device according to the first embodiment of the present invention.
Figure 5B:
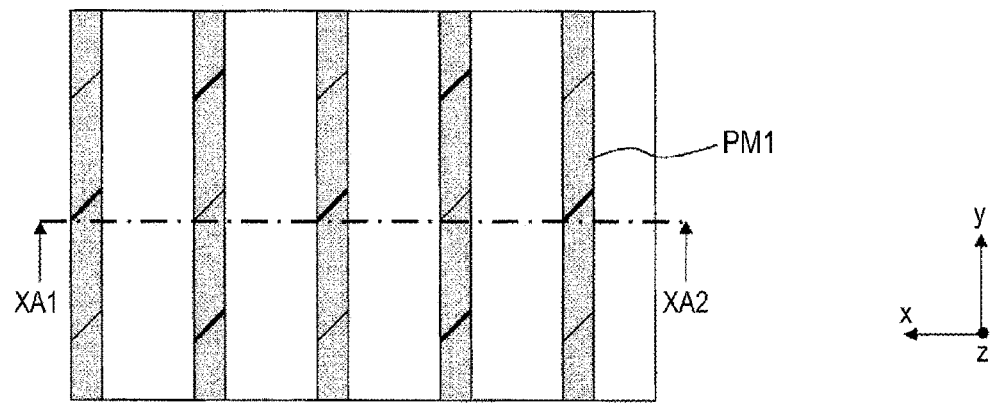

In this process, first, a re-exposure step is performed as shown in FIGS. 5A and 5B.

In the re-exposure step, as shown in FIGS. 5A and 5B, the re-exposure is performed by irradiating exposure light onto the entire surface of the substrate 101 where the first resist pattern PM1 is formed.

Here, the re-exposure is performed by irradiating light having the same wavelength as that of the exposure light irradiated in the exposure of the first resist pattern formation process (S21), onto the first resist pattern PM1. As a result, since the same equipment as that used in the first resist pattern formation process is also employed in this re-exposure step, it is preferable that no dedicated equipment is demanded.

It is preferable that the re-exposure is performed with a larger exposure amount than that of the exposure of the first resist pattern formation process (S21). Particularly, it is preferable that the re-exposure is performed with a double or more exposure amount than that of the exposure of the first resist pattern formation process (S21).

Therefore, the re-exposure is performed, for example, under the following condition.

[Exposure Condition]
exposure amount: 600 J/m$^2$

Figure 6A:
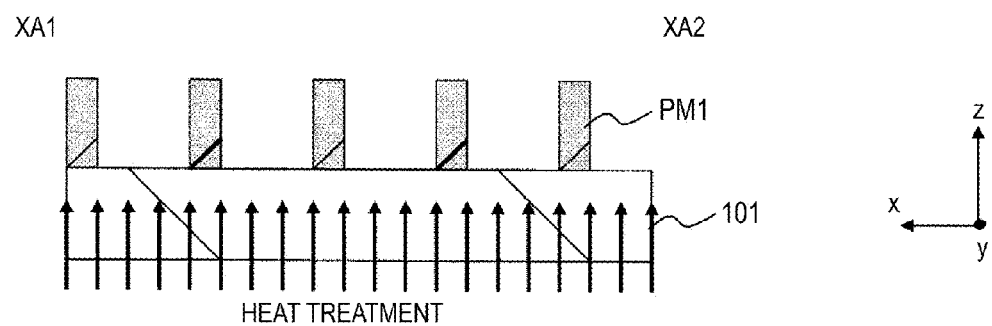
FIGS. 6A and 6B illustrate a method of manufacturing a semiconductor device according to the first embodiment of the present invention.
Figure 6B:
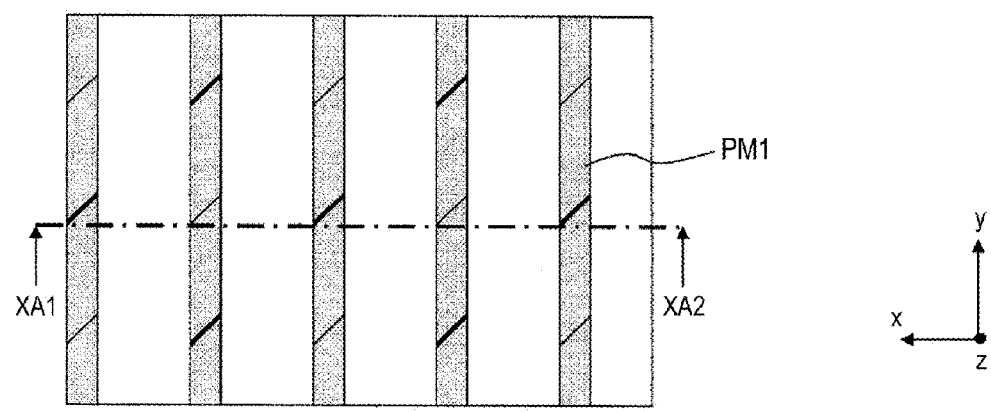

Then, as shown in FIGS. 6A and 6B, the heat treatment step is performed.

In the heat treatment step, the first resist pattern PM1 subjected to the re-exposure is heated.

Here, as shown in FIGS. 6A and 6B, heat treatment is performed to heat the substrate 101 from the lower surface thereof.

It is preferable that this heat treatment is performed with a higher heating temperature than that of the heat treatment performed in the first resist pattern formation process (S21).

Accordingly, the heat treatment is performed, for example, under the following condition.

[Heat Treatment Condition]
heating temperature: 180° C.
heating time: 120 seconds Through such steps, it is possible to insolubilize the first resist pattern PM1. Specifically, it is envisaged that the first resist pattern PM1 is insolubilized due to the following mechanism. In general, in the chemical amplification positive-type resist material, the acid produced by the exposure is reacted to detach a polymer protection group during the PEB, the polymer detached from the polymer protection group is dissolved into the developer, so that the pattern is formed. It is envisaged that, if the acid is excessively produced more than the amount necessary to detach the protection group in this mechanism, it also affects the cross-linking reaction between polymer molecules due to the produced acid and the thermal energy generated during the PEB so that they may be insolubilized against the developer. That is, it is estimated that a phenomenon called "negative of a positive resist" is generated by performing the aforementioned insolubilization, and thus, the insolubilization can be realized.

(A-4) Second Resist Film Formation Process (S41)

Next, as shown in FIG. 1, a second resist film formation process is performed (S41).

Figure 7A:
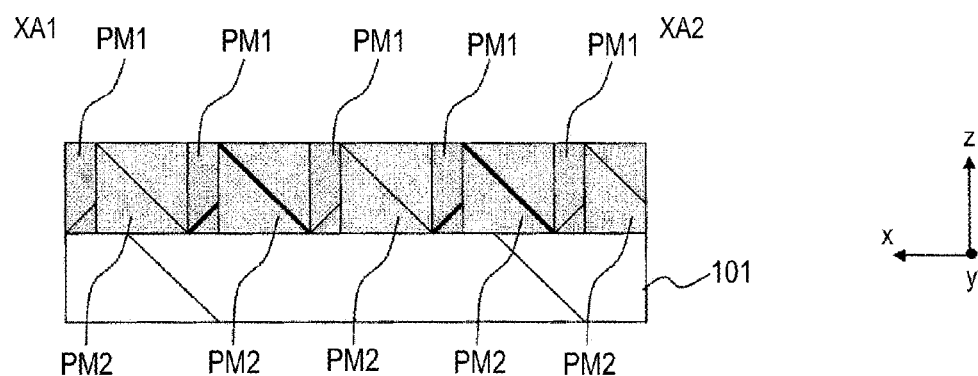
FIGS. 7A and 7B illustrate a method of manufacturing a semiconductor device according to the first embodiment of the present invention.
Figure 7B:
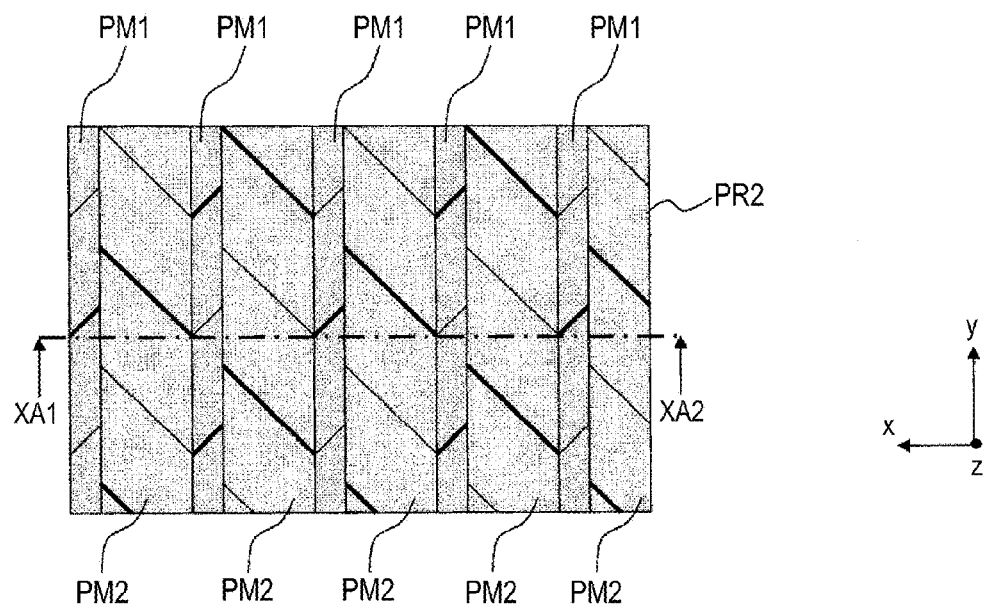

Here, as shown in FIGS. 7A and 7B, the second resist film PR2 is formed.

Specifically, as shown in FIG. 7A, the second resist film PR2 is formed on the surface of the substrate 101 to bury space between first resist patterns PM1. That is, as shown in FIG. 7B, the second resist film PR2 is formed between a plurality of first resist patterns PM1 extending in a longitudinal direction (y).

In order to perform a process of forming the second resist film PR2, similar to the first resist film PR1, for example, a positive-type chemical amplification resist material is used as a photoresist. Alternatively, various kinds of resist materials such as a negative-type chemical amplification resist material may be arbitrarily used. The second resist film PR2 is formed to have a film thickness equal to or larger than 500 nm and equal to or smaller than 5000 nm.

In this case, since the first resist pattern PM1 is processed to be insolubilized against solvent of the resist material of this process by the aforementioned insolubilization process (S31), the pattern shape is maintained without change.

(A-5) Second Resist Pattern Formation Process (S51)

Next, as shown in FIG. 1, a second resist pattern formation process is performed (S51).

Here, the second resist pattern PM2 is formed through each of the steps shown in FIGS. 8A, 8B, 9A, and 9B.

Figure 8A:
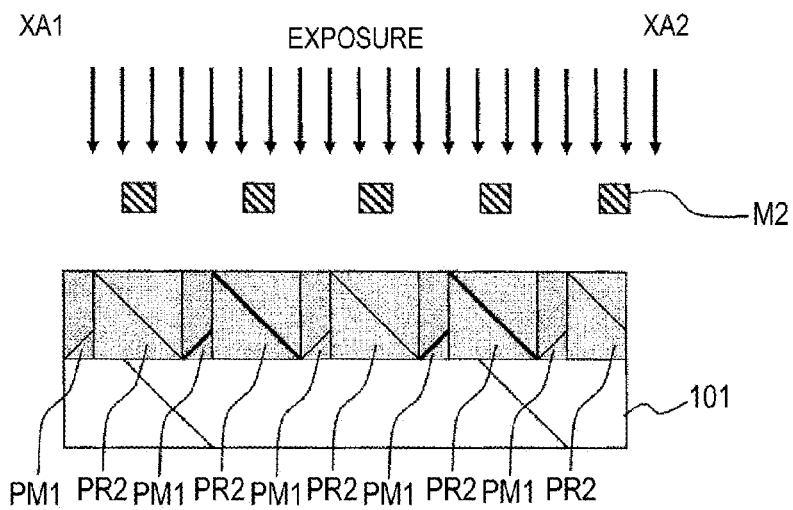
FIGS. 8A and 8B illustrate a method of manufacturing a semiconductor device according to the first embodiment of the present invention.
Figure 8B:
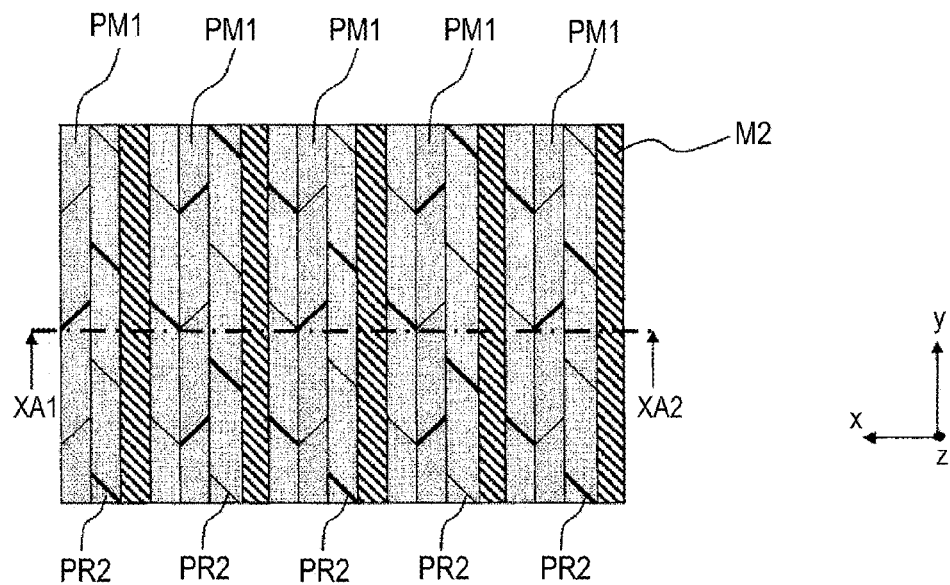

First, as shown in FIGS. 8A and 8B, exposure for transferring a pattern image to the second resist film PR2 is performed using a photomask M2 having a mask pattern.

In the exposure, similar to the case of forming the first resist pattern PM1, light having a wavelength of 248 nm irradiated from KrF excimer laser is used as the exposure light. As described above, the second resist film PR2 is formed using a positive-type resist material. Therefore, in order to perform the exposure, a photomask M2 is used to allow the exposure light not to be irradiated onto a portion where the second resist pattern PM2 is formed, but to be irradiated onto other portions.

Similar to the first resist pattern PM1, the exposure is performed, for example, under the following condition.

[Exposure Condition]
exposure amount: 280 J/m$^2$

After the exposure is performed for the second resist film PR2, heat treatment and development are performed for the second resist film PR2. As a result, as shown in FIGS. 9A and 9B, the second resist pattern PM2 is formed.

Figure 9A:
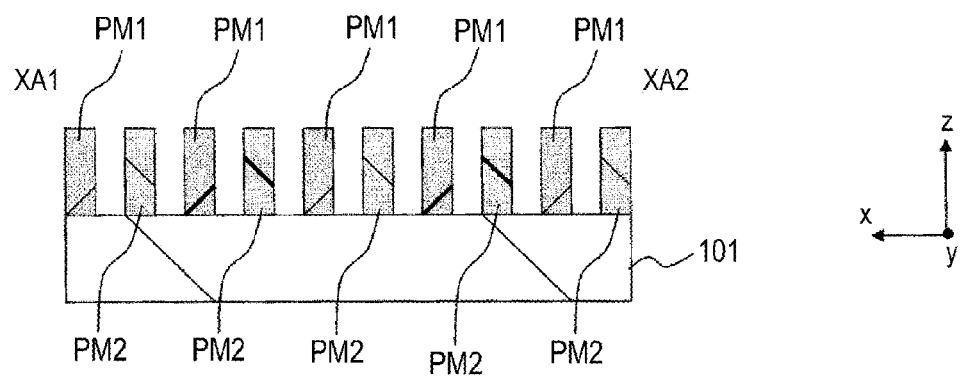
FIGS. 9A and 9B illustrate a method of manufacturing a semiconductor device according to the first embodiment of the present invention.
Figure 9B:
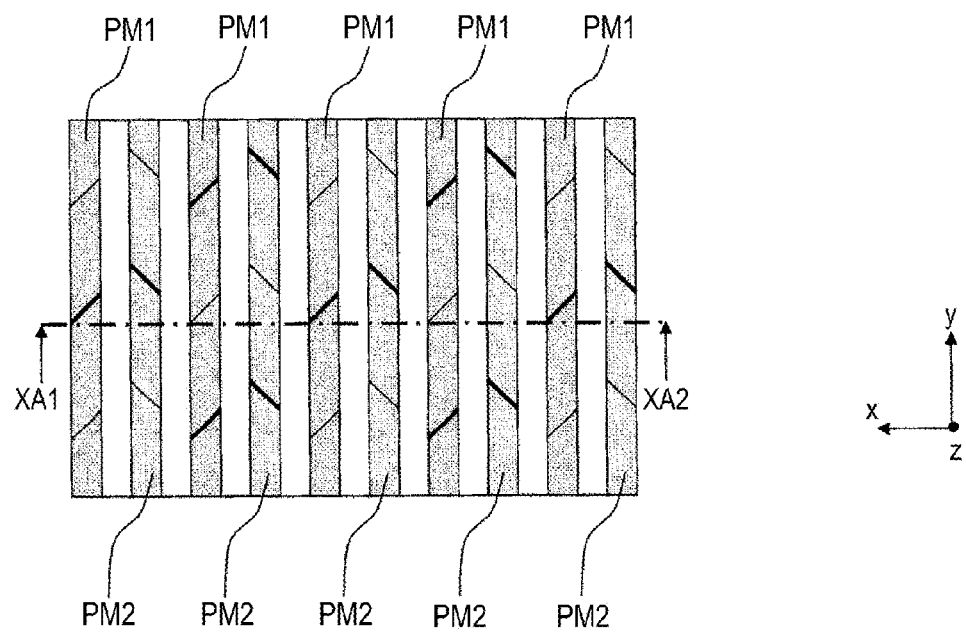

Specifically, as shown in FIG. 9A, similar to the first resist pattern PM1, the second resist pattern PM2 is formed on the surface of the substrate 101 such that a rectangular cross-sectional pattern having a convex shape is upwardly protruded in the z-direction. In addition, as shown in FIG. 9B, the second resist pattern PM2 is formed such that a plurality of patterns extending in a longitudinal direction (y) are lined with the same interval in a lateral direction (x).

Similar to the first resist pattern PM1, the heat treatment in this process is a so-called PEB (Post Exposure Bake) process and is performed, for example, under the following condition.

[Heat Treatment (PEB process) Condition]
heating temperature: 130° C.
heating time: 90 seconds In addition, similar to the first resist pattern PM1, the development in this process is performed, for example, under the following condition.

[Development Condition]

alkali developer: tetra methyl ammonium hydroxide (TMAH) aqueous solution of 2.38 wt % development time: 60 seconds

In this case, since the first resist pattern PM1 is processed to be insolubilized against a solvent of the resist material of this process by the aforementioned insolubilization process (S31), the pattern shape is maintained without change.

As a result, a line-and-space pattern including the first resist pattern PM1 and the second resist pattern PM2 is formed.

(B) Conclusion

As described above, according to the double-patterning method of the present embodiment, the first resist pattern PM1 and the second resist pattern PM2 are sequentially formed. Here, the first resist film PR1 for patterning the first resist pattern PM1 is formed on the substrate 101 using a positive-type photoresist material. In addition, before the process of forming the second resist film PR2 for patterning the second resist pattern PM2, an insolubilization process for insolubilizing the first resist pattern PM1 is performed. In this insolubilization process, the re-exposure step and the heat treatment step are performed. In this re-exposure step, re-exposure is performed such that light having the same wavelength as that of the exposure light irradiated in the exposure of the first resist pattern formation process is irradiated onto the first resist pattern PM1. Furthermore, in the heat treatment step, heat treatment for heating the first resist pattern PM1 subjected to the re-exposure process is performed.

As a result, as described above, it is possible to realize insolubilization of the first resist pattern PM1.

FIGS. 10A to 10D are electron beam microscope photographs showing insolubility of the developer and the solvent of the photoresist material for the first resist pattern PM1 subjected to the insolubilization according to the first embodiment of the present invention.

Figure 10A:
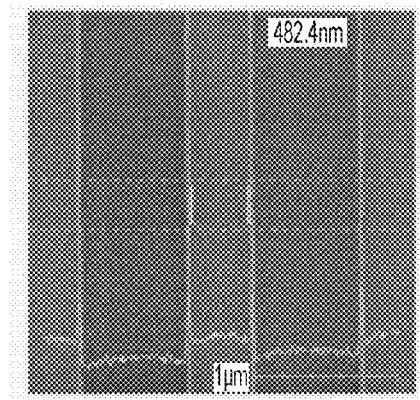
FIGS. 10A to 10D are electron beam microscope photographs showing insolubility against a solvent and a developer of the photoresist material for the first resist pattern PM1 subjected to the insolubilization according to the first embodiment of the present invention.
Figure 10B:
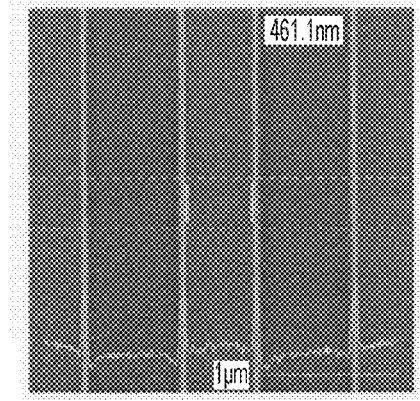
Figure 10C:
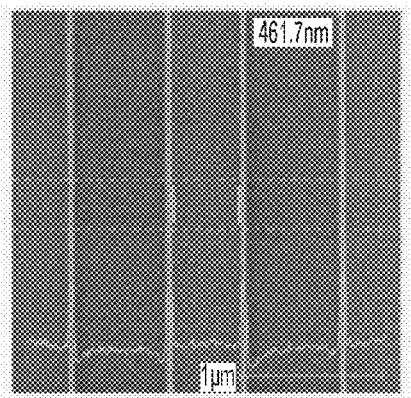
Figure 10D:
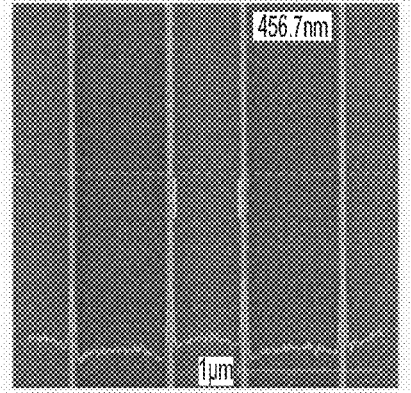

FIG. 10A illustrates a state after forming the first resist pattern PM1. FIG. 10B illustrates a state after performing the aforementioned insolubilization for the first resist pattern PM1. FIG. 10C illustrates a state after processing the first resist pattern PM1 using the solvent of the photoresist material. FIG. 10D illustrates a state after processing the first resist pattern PM1 after processing it using the developer.

As shown in FIG. 10C, when insolubility against the solvent of the photoresist material was observed for the first resist pattern PM1 subjected to the aforementioned insolubilization, it was recognized that the shapes of FIGS. 10A and 10B are maintained (here, the insolubility against the mixed solvent is set to PGME:PGMEA=70:30).

As shown in FIG. 10D, when insolubility against the developer was observed for the first resist pattern PM1 subjected to the aforementioned insolubilization, it was recognized that the shapes shown in FIGS. 10A and 10B are maintained.

Therefore, according to the present embodiment, since it is possible to realize insolubilization without necessitating any dedicated material or equipment, it is possible to prevent process cost from increasing.

In addition, since broadband light is not used unlike other processes such as UV-curing, it is possible to prevent the pattern from being deformed when a film temperature increases due to optical absorption.

Figure 11:
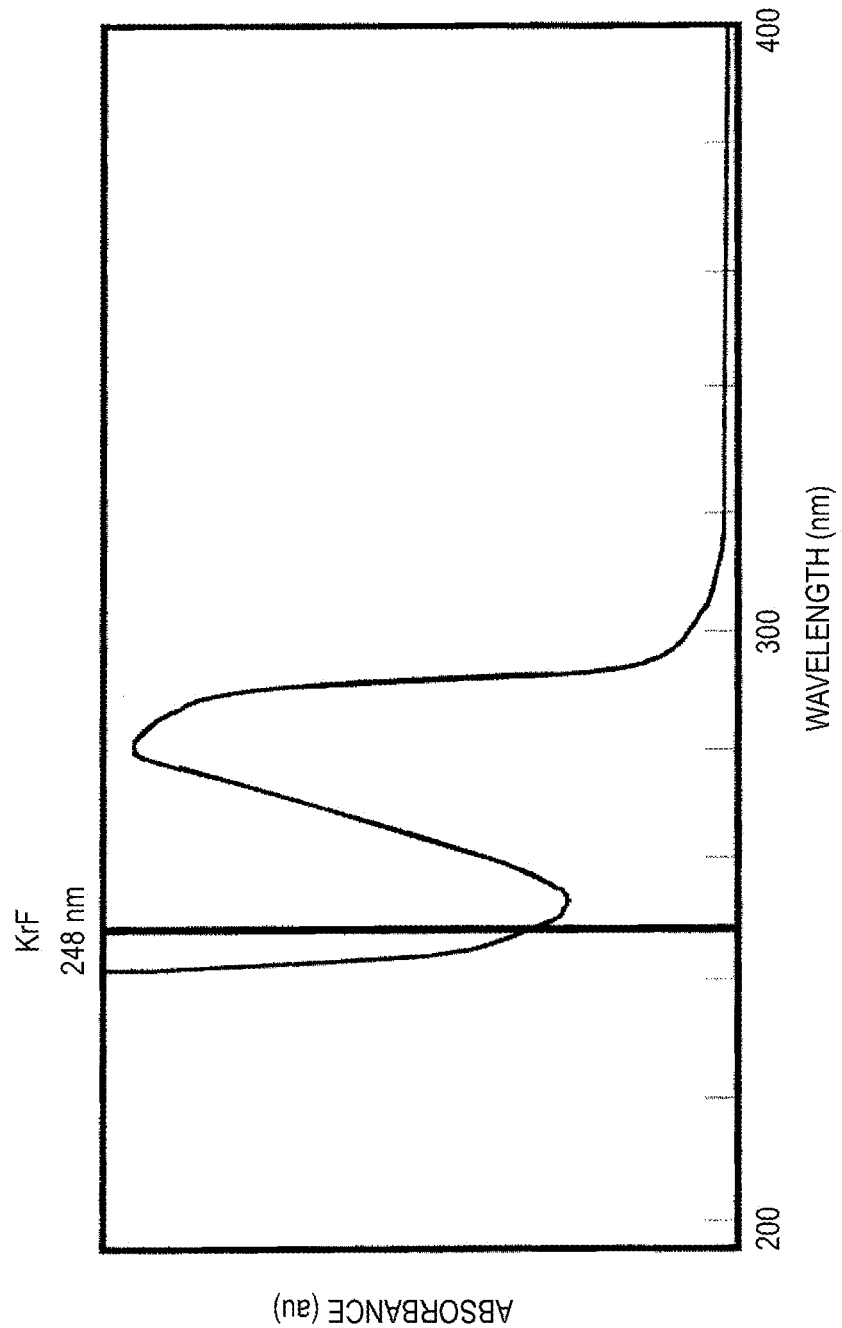
FIG. 11 illustrates an example of optical absorption in base resin of a photoresist material.

FIG. 11 illustrates an example of optical absorption of base resin in the photoresist material. In FIG. 11, the abscissa denotes a wavelength λ (nm) of light, and the ordinate denotes absorbance.

As shown in FIG. 11, in the case of a single exposure wavelength such as KrF excimer laser, the photoresist material has relatively small absorbance, and thus, the rise of the film temperature is not large. On the contrary, in the case of broadband light used in the UV-curing, the absorbance has a large wavelength range, and thus, the film temperature may significantly increase.

Accordingly, according to the present embodiment, it is possible to prevent the film temperature from increasing by optical absorption. Therefore, it is possible to prevent deformation of the pattern.

Accordingly, according to the embodiment of the present invention, it is possible to improve manufacturing efficiency and readily realize cost reduction.

In addition, according to the present embodiment, the exposure amount in the re-exposure step of the insolubilization process is larger than the exposure amount in the exposure of the first resist pattern formation process. Accordingly, it is possible to realize insolubilization of the first resist pattern PM1 more effectively.

According to the present embodiment, in the heat treatment step of the insolubilization process, the heat treatment for the first resist pattern PM1 is performed at a higher heating temperature than that in the heat treatment of the first resist pattern formation process. Therefore, it is possible to realize insolubilization of the first resist pattern PM1 more effectively.

(C) Modifications

While, in the aforementioned embodiment, a case where two line-and-space patterns are lined in parallel is described, the present invention is not limited thereto, but may be applicable to various modifications as described below.

(C-1) Modification 1

Figure 12A:
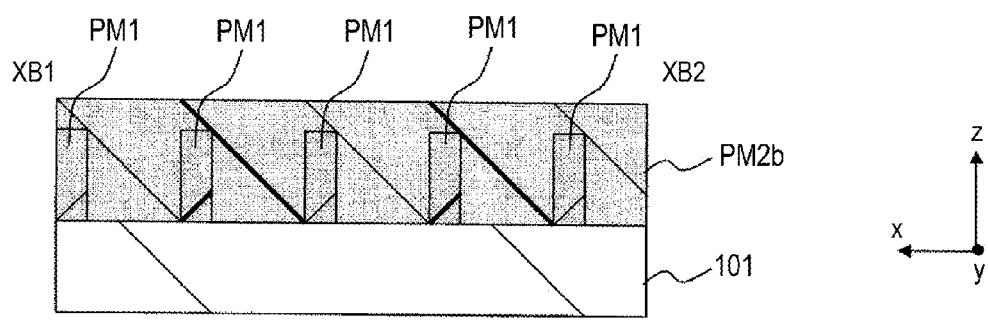
FIGS. 12A and 12B illustrate a modification of the first embodiment of the present invention.
Figure 12B:
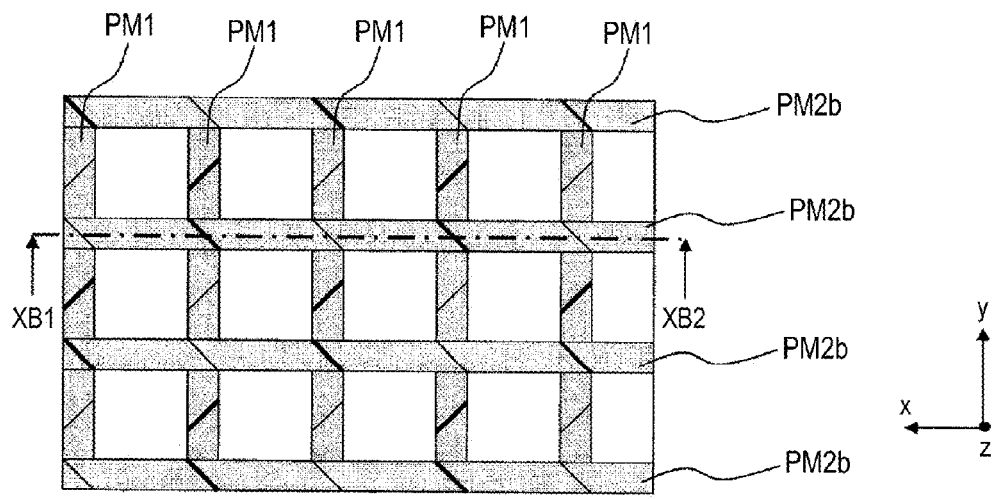

FIGS. 12A and 12B illustrate a modification of the first embodiment of the present invention.

FIG. 12A is a cross-sectional view, and FIG. 12B is a top plan view. FIG. 12A illustrates a cross-section along the line XB1-XB2 of FIG. 12B.

As shown in FIGS. 12A and 12B, the first resist pattern PM1 is formed as described above. In addition, insolubilization is performed for the first resist pattern PM1 as described above.

As shown in FIGS. 12A and 12B, in the second resist pattern PM2b, unlike the aforementioned case, a plurality of patterns extending in a lateral direction (x) are lined in a longitudinal direction (y) with the same interval. Here, the second resist pattern PM2 is formed such that at least a part of the second resist pattern PM2b is laminated in the first resist pattern PM1.

As such, a hole pattern may be formed by overlappingly forming a line-and-space pattern having two layers perpendicular to each other. As a result, it is possible to form a fine hole pattern compared to the case where the pattern is formed at a time.

(C-2) Modification 2

Figure 13A:
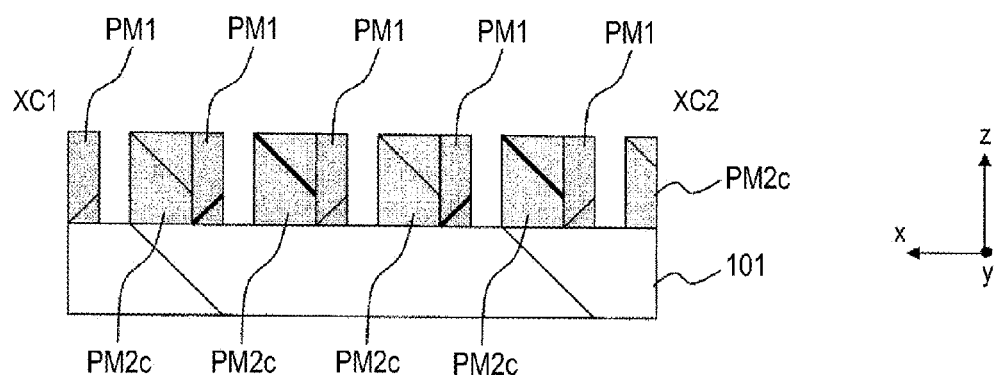
FIGS. 13A and 13B illustrate a modification of the first embodiment of the present invention.
Figure 13B:
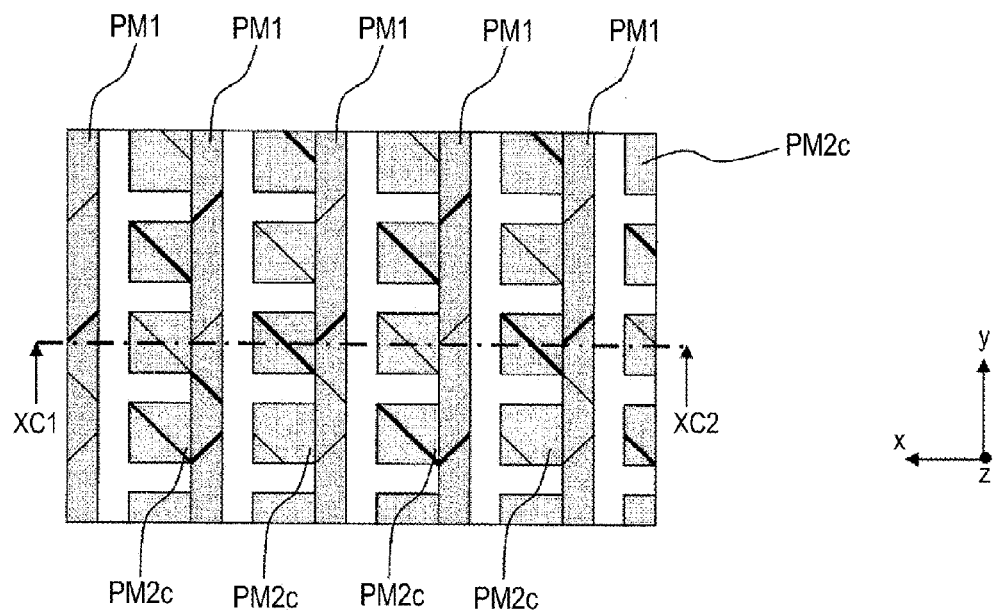

FIGS. 13A and 13B illustrate a modification of the first embodiment of the present invention.

FIG. 13A is a cross-sectional view, and FIG. 13B is a top plan view. FIG. 13A illustrates a cross-section along the line XC1-XC2 of FIG. 13B.

As shown in FIGS. 13A and 13B, the first resist pattern PM1 is formed as described above. Similar to the aforementioned case, insolubilization is performed for the first resist pattern PM1.

Then, as shown in FIGS. 13A and 13B, for the second resist pattern PM2c, unlike the aforementioned case, a pattern having a square plane is formed to have a matrix shape lined in a longitudinal direction (y) and a lateral direction (x).

As such, a complicated pattern difficult to be formed at a single time may be formed by dividing the process into two stages. In other words, this modification is effectively applicable to a case where densely pitched patterns and sparsely pitched patterns are mixedly provided, and a process margin may not be guaranteed. In addition, this modification is also effectively applicable to a case where it is difficult to form corners of the pattern appropriately.

While, in this modification, a case where a process of forming the pattern is divided into two stages is described, the process of forming the pattern may be divided into three or more stages. When the process is divided into three or more stages, the insolubilization is also performed for the resist patterns formed after the second or subsequent stages.

(C-3) Modification 3

Figure 14A:
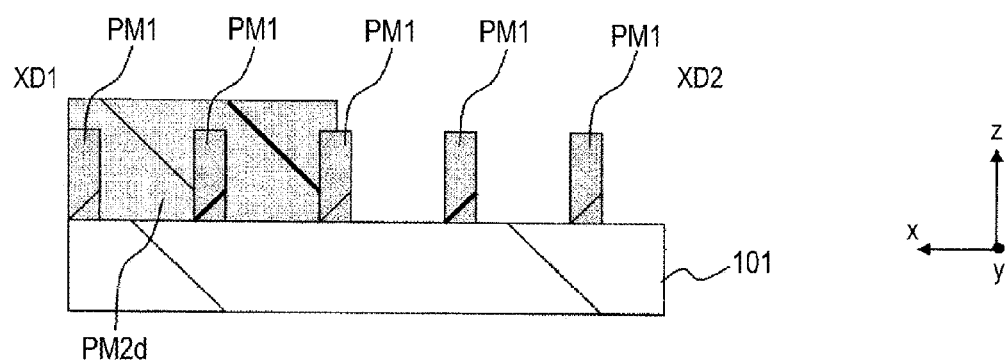
FIGS. 14A and 14B illustrate a modification of the first embodiment of the present invention.
Figure 14B:
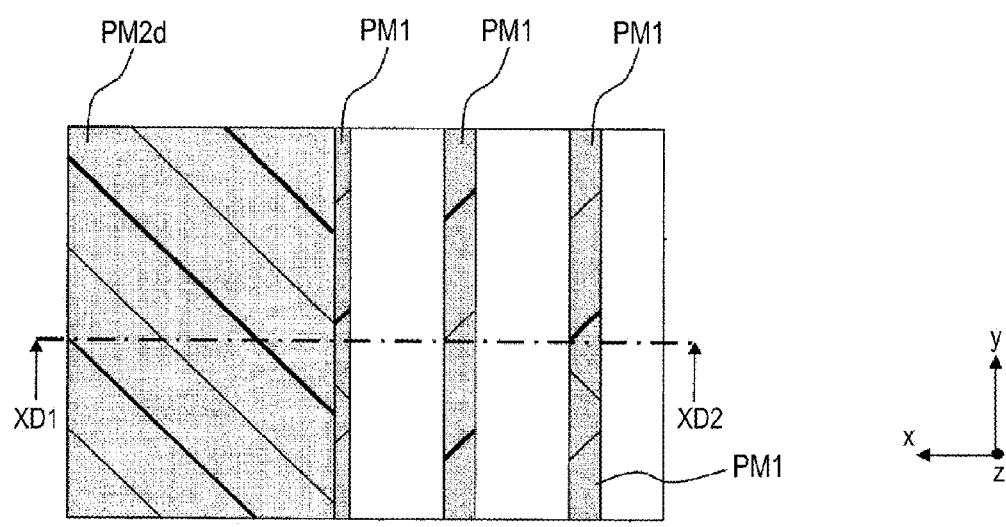

FIGS. 14A and 14B illustrate a modification of the first embodiment of the present invention.

FIG. 14A is a cross-sectional view, and FIG. 14B is a top plan view. FIG. 14A illustrates a cross-section along the line XD1-XD2 of FIG. 14B.

As shown in FIGS. 14A and 14B, the first resist pattern PM1 is formed as described above. In addition, insolubilization is performed for the first resist pattern PM1 as described above.

Then, as shown in FIGS. 14A and 14B, unlike the aforementioned case, the second resist pattern PM2$d$ is formed to cover a part of the first resist pattern PM1.

As such, this modification may be applicable to a case where the second layer pattern is formed to cover the pattern accessorily formed when the first layer pattern is formed. In this method, it is possible to expose only a main pattern necessary in the subsequent process (such as ion implantation) by overlappingly forming the second layer pattern even when the subsidiary pattern is arranged when the first layer pattern is formed. Therefore, since a subsidiary pattern for improving resolution or a subsidiary pattern for reducing unevenness of the line width can be arbitrarily arranged and covered as necessary, it is possible to improve a process margin.

(C-4) Modification 4

Figure 15A:
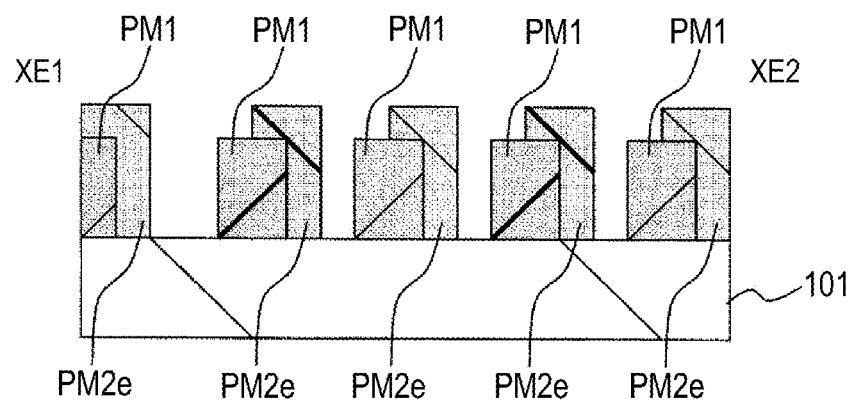
FIGS. 15A and 15B illustrate a modification of the first embodiment of the present invention.
Figure 15B:
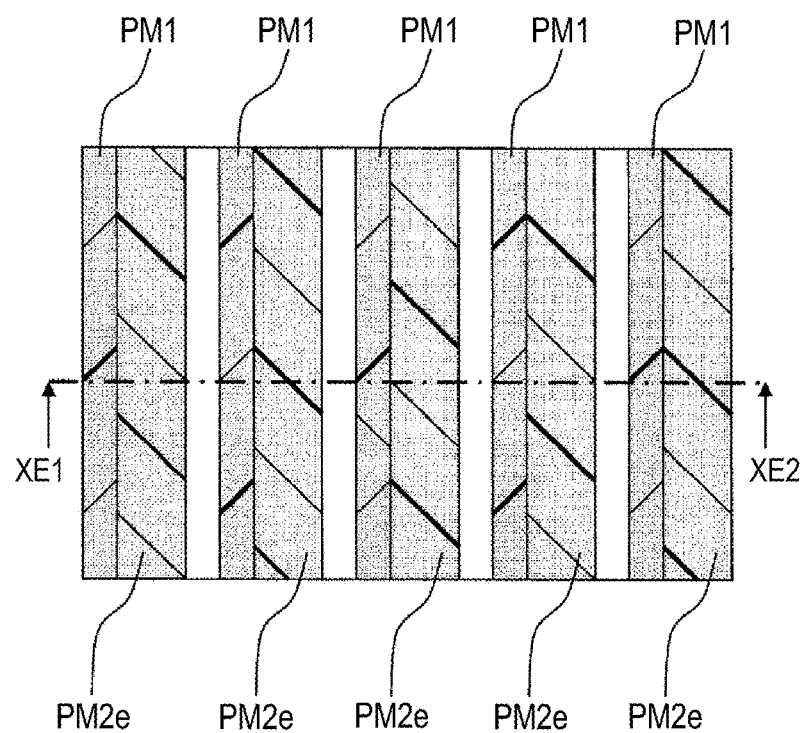

FIGS. 15A and 15B illustrate a modification of the first embodiment of the present invention.

FIG. 15A is a cross-sectional view, and FIG. 15B is a top plan view. FIG. 15A illustrates a cross-section along the line XE1-XE2 of FIG. 15B.

As shown in FIGS. 15A and 15B, the first resist pattern PM1 is formed as described above. In addition, insolubilization is performed for the first resist pattern PM1 as described above.

Then, as shown in FIGS. 15A and 15B, unlike the aforementioned case, the second resist pattern PM2$e$ is formed such that a plurality of patterns extending in a longitudinal direction (y) are lined in a lateral direction (x) with the same interval with a part of the first resist pattern PM1 being laminated.

As such, the resist pattern may be formed by overlappingly laminating patterns in a vertical direction. This method is effectively applicable when a three-dimensional impurity distribution is formed in a single process or when a dual damascene structure is formed in a single process. This method is also effectively applicable to a case where the second layer resist pattern is formed with the first layer pattern remaining after the first layer pattern and the subsequent processes (such as ion implantation or etching).

While this modification has been described regarding a case where the pattern is formed by dividing the process into two stages, the pattern may be formed by dividing the process into three or more stages. In addition, when the process is divided into three or more stages, insolubilization is also performed for the second and subsequent layer resist patterns. It is preferable that the film thickness of the resist used to form the second and subsequent layer resist patterns is appropriately adjusted considering that they are formed on the resist pattern that has been previously formed.

(C-5) Other Modifications

The aforementioned insolubilization may be performed by combining various shrink technologies (such as a chemical shrink, a thermal flow shrink, or an ion shrink). In this case, various shrink technologies may be appropriately introduced into several points after the resist pattern is formed or after the insolubilization is performed. As a result, it is possible to form further miniaturized patterns.

In addition, after the insolubilization condition is previously set through the aforementioned process, insolubilization may be performed based on the condition that has been set. This example will be described in detail in the fourth embodiment below.

<2. Second Embodiment>

(A) Manufacturing Method Etc.

FIGS. 16, 17A, 17B, 18A, and 18B illustrate a method of manufacturing a semiconductor device according to the second embodiment of the present invention.

Figure 16:
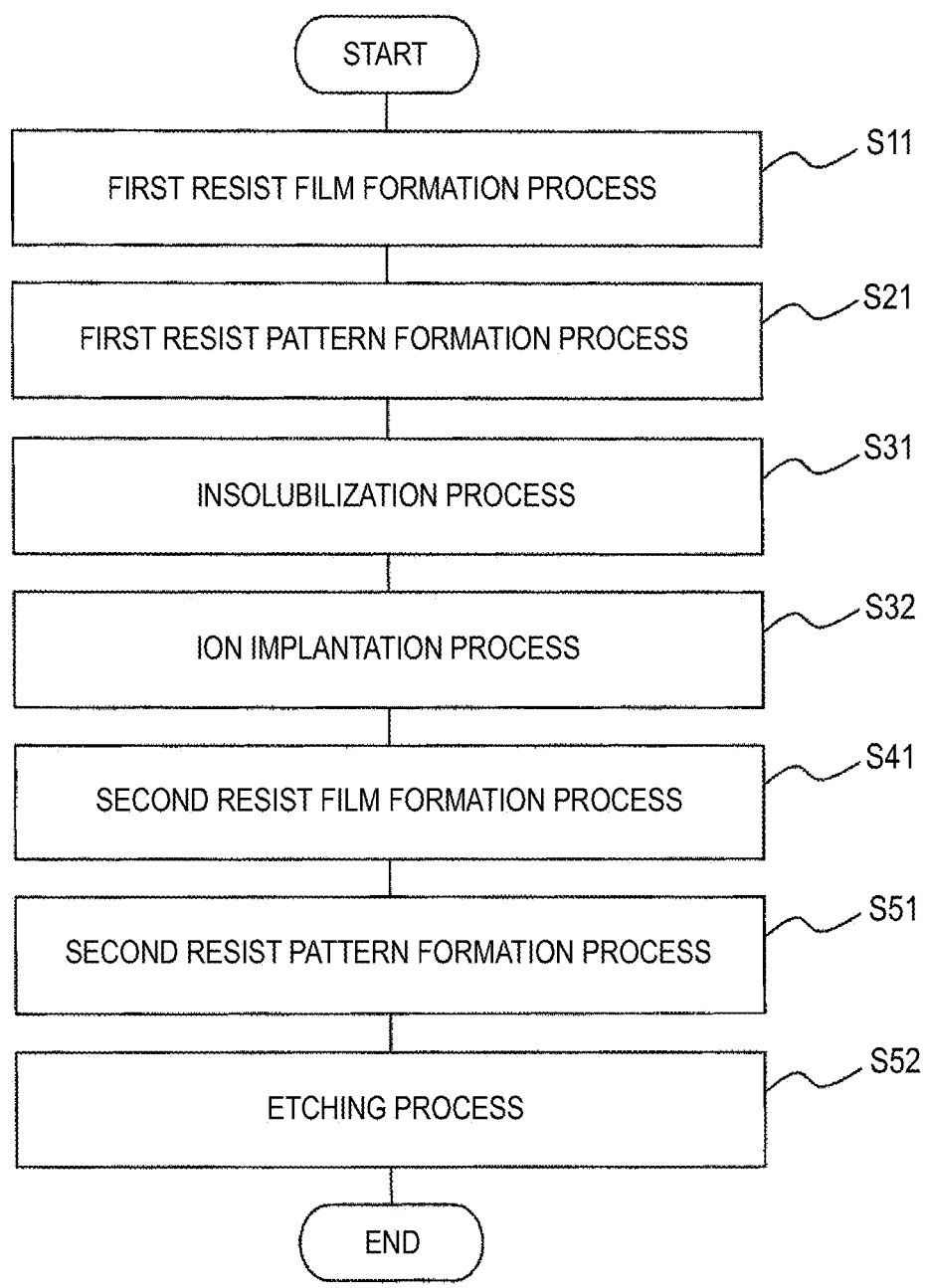
FIG. 16 illustrates a method of manufacturing a semiconductor device according to a second embodiment of the present invention.

Here, FIG. 16 is a flowchart illustrating a method of manufacturing a semiconductor device according to the present embodiment.

Figure 17A:
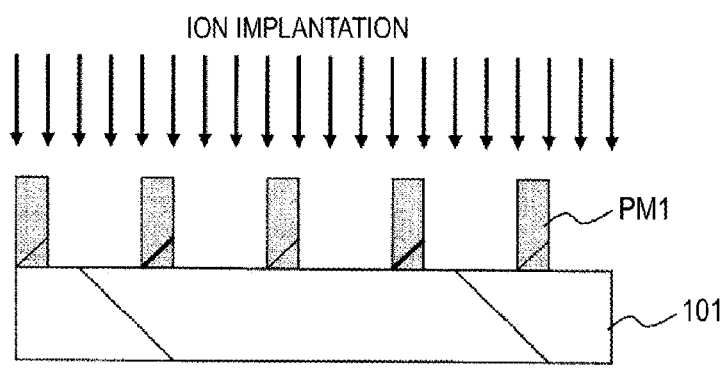
FIGS. 17A and 17B illustrate a method of manufacturing a semiconductor device according to the second embodiment of the present invention.
Figure 17B:
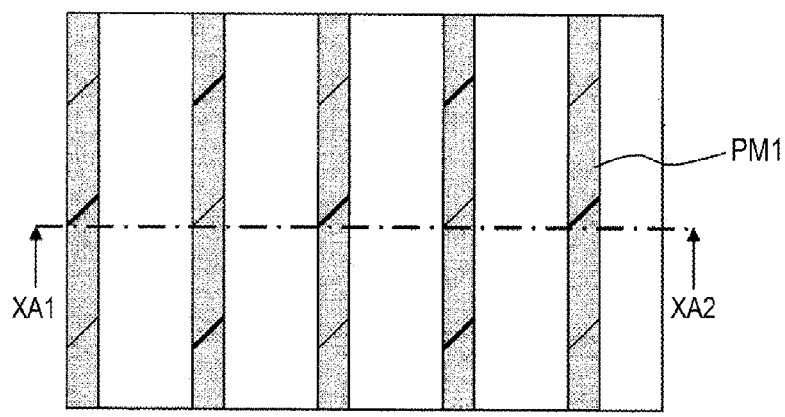
Figure 18A:
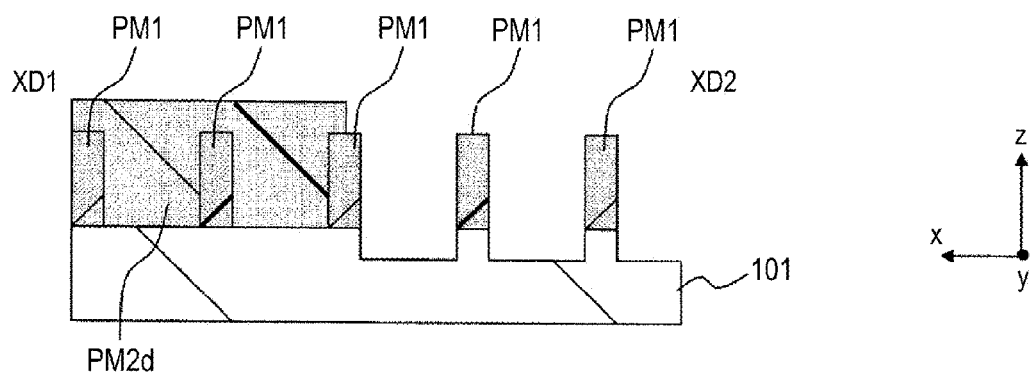
FIGS. 18A and 18B illustrate a method of manufacturing a semiconductor device according to the second embodiment of the present invention.
Figure 18B:
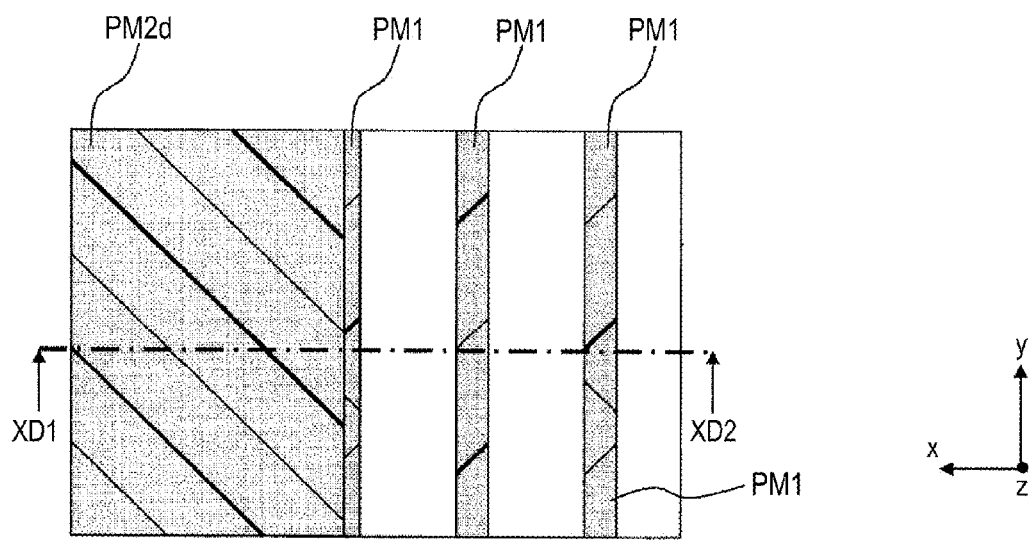

FIGS. 17A to 18B illustrate each process of manufacturing the semiconductor device according to the present embodiment. FIGS. 17A and 18A are cross-sectional views, and FIGS. 17B and 18B are top plan views. FIGS. 17A and 18A illustrate cross-sections along the line XA1-XA2 and XD1-XD2 of FIGS. 17B and 18B, respectively.

As shown in FIG. 16, in the present embodiment, the ion implantation process (S32) and the etching process (S52) are included unlike the first embodiment. Except for this point, this embodiment is similar to the first embodiment. Therefore, descriptions of similar elements will be omitted.

(A-1) Ion Implantation Process (S32)

In the present embodiment, as shown in FIG. 16, the first resist film formation process (S11), the first resist pattern formation process (S21), and the insolubilization process (S31) are sequentially performed similar to the first embodiment. Then, as shown in FIG. 16, the ion implantation process (S32) is performed before the second resist film formation process (S41).

In the first resist film formation process (S11) and the first resist pattern formation process (S21), the first resist pattern PM1 is formed as shown in FIGS. 4A and 4B. In other words, on the surface of the substrate 101, the first resist pattern PM1 is formed such that a plurality of patterns extending in a longitudinal direction (y) are lined with the same interval in a lateral direction (x). In the insolubilization process (S31), similar to the first embodiment, insolubilization is performed for the first resist pattern PM1.

Then, in the ion implantation process (S32), as shown in FIGS. 17A and 17B, the ion implantation is performed to implant impurities to the surface of the substrate 101, which is a semiconductor substrate, using the first resist pattern PM1 as a mask.

Specifically, the ion implantation is performed such that impurities are implanted to the portions that are not covered with the first resist pattern PM1 but exposed on the surface of the substrate 101.

(A-2) Etching Process (S52)

After the aforementioned process, as shown in FIG. 16, the second resist film formation process (S41) and the second resist pattern formation process (S51) are sequentially performed. In addition, as shown in FIG. 16, after the second resist pattern formation process (S51), the etching process is performed (S52).

In the second resist film formation process (S41) and the second resist pattern formation process (S51), the second resist pattern PM2d is formed as shown in FIGS. 14A and 14B in conjunction with the modification 3 of the first embodiment. That is, the second resist pattern PM2d is formed to cover a part of a plurality of line patterns included in the first resist pattern PM1.

As shown in FIGS. 18A and 18B, in the etching process (S52), etching is performed for the surface of the substrate 101 using the first resist pattern PM1 and the second resist pattern PM2 as a mask.

Specifically, on the surface of the substrate 101, the exposed portions that are not covered by the first resist pattern PM1 and the second resist pattern PM2 are etched.

(B) Conclusion

As described above, in the double-patterning method of the present embodiment, similar to the first embodiment, each of the first resist pattern PM1 and the second resist pattern PM2d is sequentially formed. That is, similar to the first embodiment, an insolubilization process for insolubilizing the first resist pattern PM1 is performed before the process of forming the second resist film PR2d patterned to the second resist pattern PM2.

Accordingly, according to the present embodiment, similar to the first embodiment, it is possible to improve manufacturing efficiency and readily realize cost reduction.

In addition, according to the present embodiment, since the resist pattern is used for both the ion implantation and the etching process, it is possible to reduce the number of processes. Since the resist pattern is formed as an exposure alignment mark for the processes subsequent to the ion implantation process, it is possible to realize improvement of superimposition accuracy and process controllability.

While, in the aforementioned description, the ion implantation process (S32) is performed after the insolubilization process (S31), the present invention is not limited thereto. The ion implantation process (S32) may be performed before the insolubilization process (S31).

<3. Third Embodiment>

(A) Manufacturing Method Etc.

FIGS. 19 and 20A to 20D illustrate a method of manufacturing a semiconductor device according to the third embodiment of the present invention.

Figure 19:
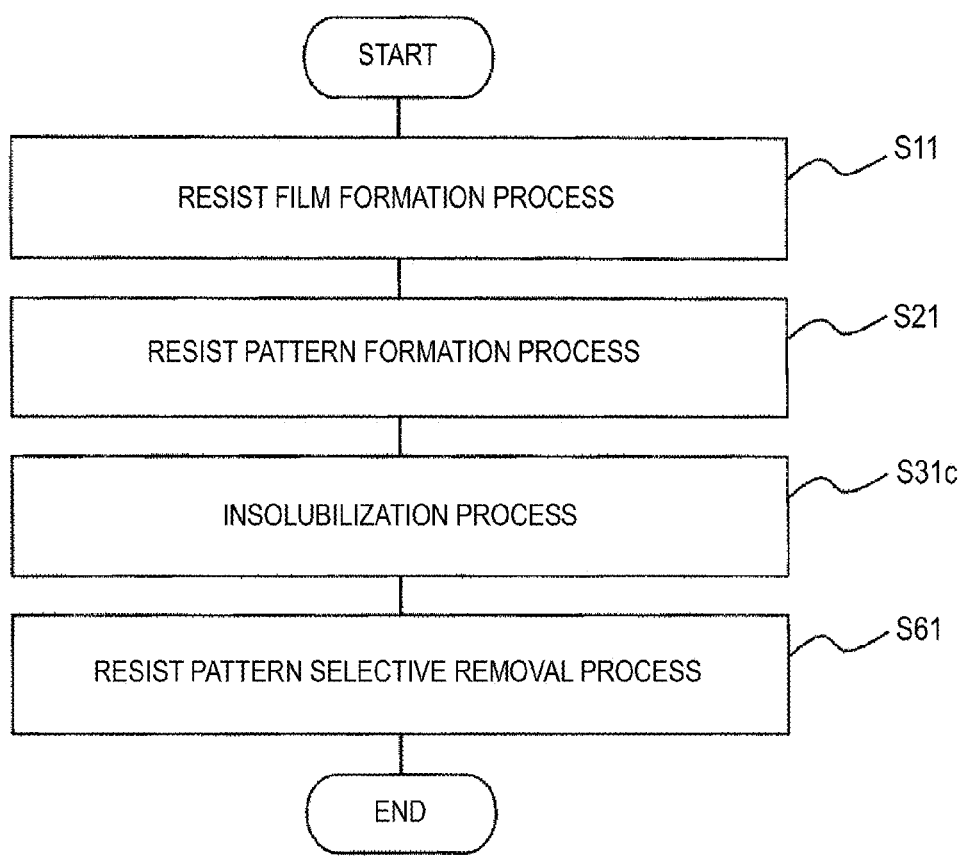
FIG. 19 illustrates a method of manufacturing a semiconductor device according to a third embodiment of the present invention.

Here, FIG. 19 is a flowchart illustrating a method of manufacturing a semiconductor device according to the present embodiment. FIGS. 20A to 20D are cross-sectional views illustrating each process of manufacturing the semiconductor device according to the present embodiment.

As shown in FIG. 19, according to the present embodiment, the insolubilization (S31c) is different from that of the first embodiment. In addition, the resist pattern selective removal process (S61) is performed without performing the second resist film formation process (S41) and the second resist pattern formation process (S51). Except for that, the present embodiment is similar to the first embodiment. Therefore, descriptions for similar elements will be omitted.

(A-1) Insolubilization (S31c)

According to the present embodiment, as shown in FIG. 19, the resist film formation process (S11) and the resist pattern formation process (S21) are sequentially performed.

Here, each of the first resist film formation process (S11) and the first resist pattern formation process (S21) is performed similar to the first embodiment. That is, as shown in FIGS. 4A and 4B, first resist pattern PM1 is formed such that a plurality of patterns extending in a longitudinal direction (y) are lined in a lateral direction (x) with the same interval on the surface of the substrate 101.

Then, as shown in FIG. 19, the insolubilization process is performed (S31c).

In the insolubilization process (S31c), the resist pattern PM1 is insolubilized such that a part of the resist pattern PM1 is insolubilized against the solvent used in the resist pattern selective removal process (S61) described below.

Figure 20A:
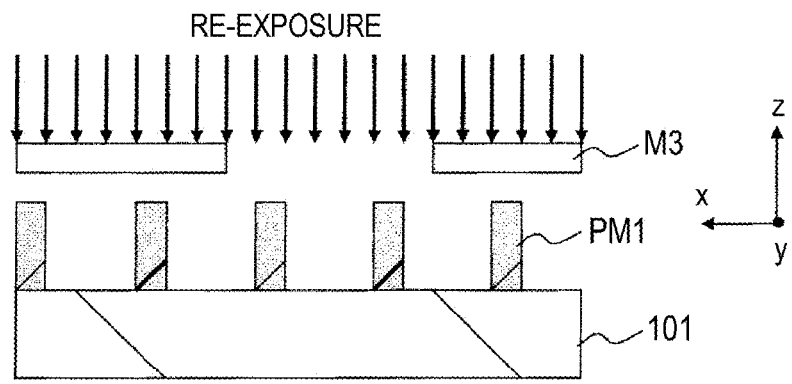
FIGS. 20A to 20D illustrate a method of manufacturing a semiconductor device according to the third embodiment of the present invention.
Figure 20B:
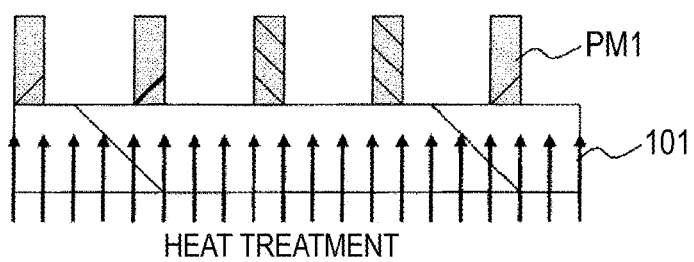

In this insolubilization process (S31c), insolubilization is performed for the resist pattern PM1 through each step shown in FIGS. 20A and 20B.

First, as shown in FIG. 20A, the re-exposure step is performed.

The re-exposure step is performed by irradiating exposure light onto a part of the surface of the substrate 101 where the resist pattern PM1 is formed as shown in FIG. 20A.

Here, as shown in FIG. 20A, a mask M3 having a pattern is arranged such that, in the resist pattern PM, exposure light passes through the portions, where the re-exposure is performed, and is blocked by the remaining portions.

In addition, re-exposure is performed such that light having the same wavelength as the exposure light used to transfer the pattern image in the exposure of the aforementioned resist pattern formation process (S21) is irradiated onto the resist pattern PM1 by interposing the mask M3. As a result, since the same equipment as that used in the resist pattern formation process is also employed in this re-exposure step, it is preferable that any dedicated equipment is not demanded.

This re-exposure is performed, for example, under the same condition as that of the first embodiment.

Then, as shown in FIG. 20B, the heat treatment step is performed.

In the heat treatment step, the resist pattern PM1 subjected to the re-exposure is heated.

Here, as shown in FIG. 20B, heat treatment is performed to heat the substrate 101 from the lower surface thereof. For example, heat treatment is performed under the same condition as that of the first embodiment.

Through such steps, it is possible to insolubilize a portion of the resist pattern PM1 subjected to the re-exposure similar to the first embodiment.

(A-2) Resist Pattern Selective Removal Process (S61)

Next, as shown in FIG. 19, the resist pattern selective removal process is performed (S61).

In the resist pattern selective removal process (S61), a portion of the resist pattern PM1 subjected to the insolubilization remains, and other portions are removed.

Figure 20C:
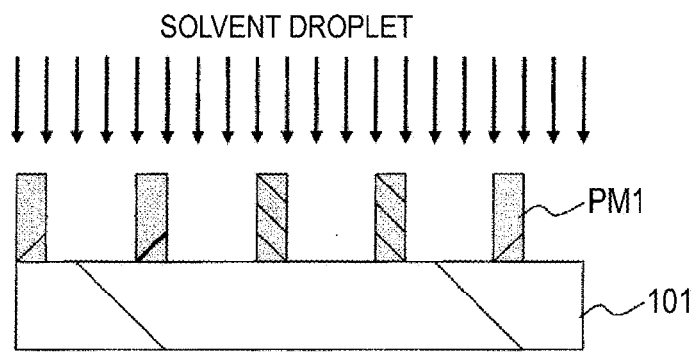
Figure 20D:
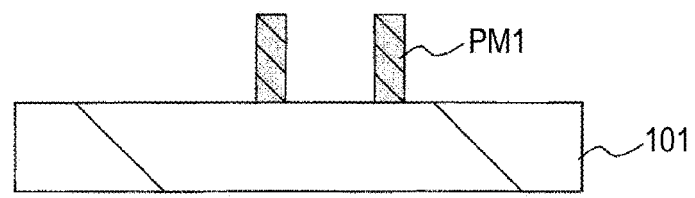

According to the present embodiment, through each step shown in FIGS. 20C and 20D, a part of the resist pattern PM1 is selectively removed. In this process, a portion of the resist pattern PM1 subjected to the re-exposure remains, and a portion where the re-exposure is not performed is removed.

Specifically, as shown in FIG. 20C, a process of dropping a solvent is performed for the entire resist pattern PM1.

For example, similar to the aforementioned resist solvent, this process is performed using the following solvent. In addition, the type of the dropped solvent is not particularly limited. Any of various resist solvent proposals may be appropriately selected.

solvent: mixed solvent of propylene glycol monomethyl ether of 70 wt % and propylene glycol monomethyl ether acetate of 30 wt %

Then, the solvent is removed from the surface of the substrate 101.

As a result, as shown in FIG. 20D, a portion of the resist pattern PM1 subjected to the re-exposure selectively remains.

(B) Conclusion

As described above, according to the present embodiment, insolubilization for insolubilizing a part of the resist pattern PM1 is performed after forming the resist pattern PM1. In the insolubilization, similar to the first embodiment, the re-exposure is performed such that light having the same wavelength as the exposure light used in the exposure for forming the resist pattern is irradiated onto a part of the resist pattern. Heat treatment for heating the resist pattern subjected to the re-exposure is performed. Then, a portion of the resist pattern PM1 subjected to the re-exposure remains, and other portions are removed.

As a result, it is possible selectively to remove the resist pattern PM1 that was initially formed to only allow desired portions of the pattern to remain. Therefore, a subsidiary pattern for improving resolution or a subsidiary pattern for reducing unevenness of the line width can be arbitrarily arranged and removed as necessary. Therefore, according to the present embodiment, it is possible to improve a process margin.

While a case where a part of the resist pattern PM1, which is a line-and-space pattern, is selectively removed has been described in the present embodiment, the present invention is not limited thereto but may be appropriately applicable to any pattern.

A double-patterning method may be applicable to the aforementioned example. As described above, after forming the resist pattern PM1 which is partially removed as described above, a separate resist pattern (the second resist pattern PM2 of the first embodiment) may be formed similar to the first embodiment. Also in this case, since the insolubilization is performed, it is possible to obtain the same effect as that of the first embodiment.

4. Fourth Embodiment (A) Manufacturing Method Etc.

Figure 21:
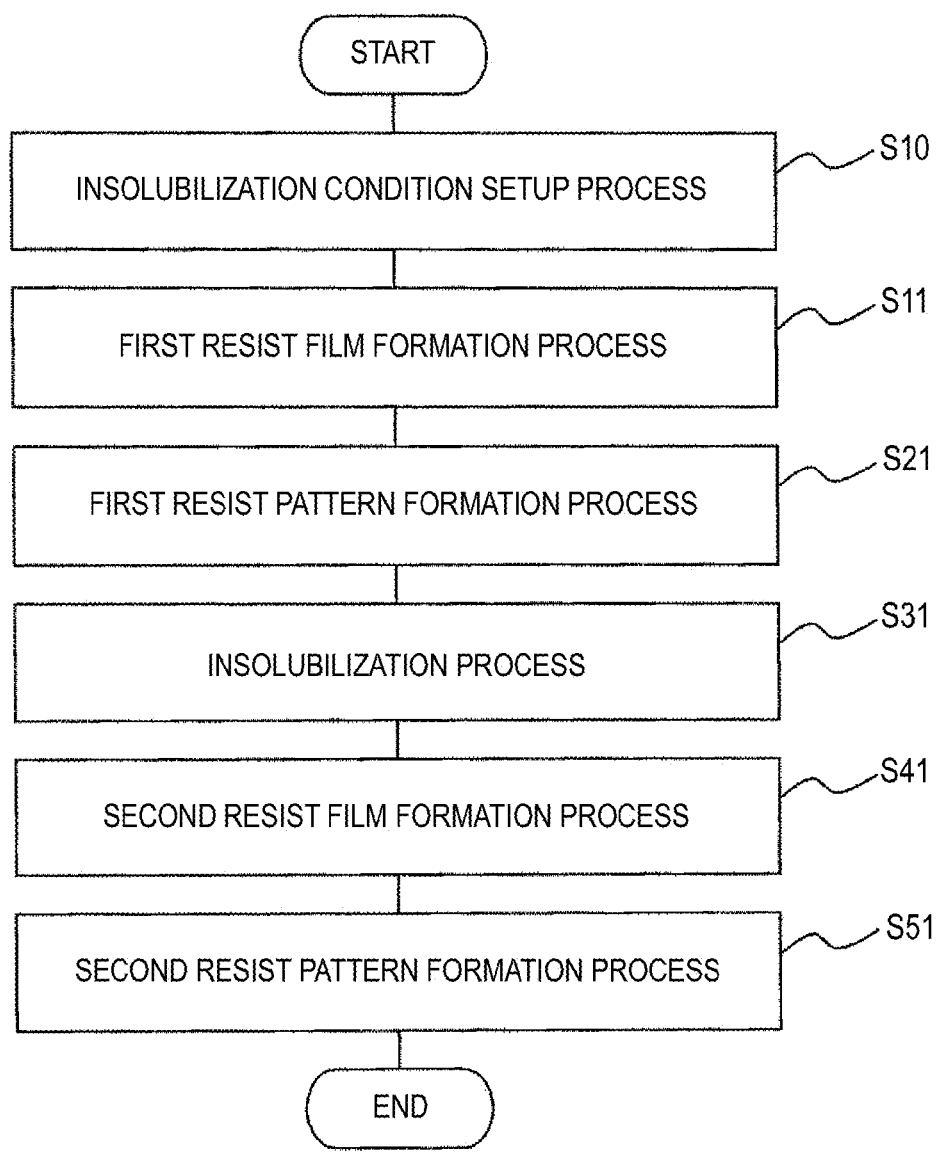
FIG. 21 is a flowchart illustrating a method of manufacturing a semiconductor device according to a fourth embodiment of the present invention.

FIG. 21 is a flowchart illustrating a method of manufacturing a semiconductor device according to the fourth embodiment of the present invention.

As shown in FIG. 21, the method according to the present embodiment further includes an insolubilization condition setting process (S10). Except for that, the present embodiment is similar to the first embodiment. Therefore, descriptions of similar elements will be omitted.

The insolubilization condition setting process (S10) is performed, for example, before the first resist film formation process (S11) as shown in FIG. 21.

In this insolubilization condition setting process (S10), the insolubilization condition necessary in the re-exposure and the heat treatment of the insolubilization process (S31) is set. In addition, in the insolubilization process (S31), insolubilization is performed based on the insolubilization condition that has been set in the insolubilization condition setting process (S10).

FIG. 22 is a flowchart illustrating an insolubilization condition setting process (S10) according to the fourth embodiment of the present invention.

First, as shown in FIG. 22, the first resist film formation step (S101) and the first resist pattern formation step (S201) are sequentially performed.

Here, the first resist pattern PM1 formed in the first resist pattern formation process (S11) (refer to FIG. 21) is prepared on the substrate 101.

Specifically, the first resist pattern PM1 is formed to have a film thickness of 500 nm using a KrF chemical amplification positive resist (Product Name AZ DX6270P, manufactured by AZ Electronic Material Co., Ltd.).

Specifically, as shown in FIGS. 4A and 4B of the first embodiment, the first resist pattern PM1 is formed on the surface of the substrate 101 such that a plurality of patterns extending in a longitudinal direction (y) are lined with the same interval in the lateral direction (x).

Then, as shown in FIG. 22, the re-exposure step is performed (S301).

Here, a re-exposure process in which light having the same wavelength as that of the exposure light used in the exposure of the first resist pattern formation step (S201) is irradiated onto the first resist pattern PM1 is performed a plurality of times under a plurality of exposure amount conditions.

Specifically, in the re-exposure step (S301), light having a wavelength of 248 nm irradiated from the KrF excimer laser is used as the exposure light. For example, each re-exposure is performed under the following condition.

[Re-exposure Condition]
exposure amount: 200, 300, 400, 500, 600, 700, 800, 900, and 1000 J/m$^2$ Then, as shown in FIG. 22, a heat treatment step is performed (S302).

Here, heat treatment for heating the first resist pattern PM1 subjected to the aforementioned re-exposure is performed a plurality of times under a plurality of heating temperature conditions.

Specifically, each heat treatment is performed to heat the substrate 101 from the lower surface thereof using a heat source such as a hot plate. For example, each heat treatment is performed under the following condition.

[Heat Treatment Condition]
heating temperature: 120, 150, 180, and 200° C.
heating time: 120 seconds Next, as shown in FIG. 22, the resist solvent treatment step (S401) and the developer treatment step (S402) are performed.

In the resist solvent treatment step (S401), each of a plurality of the first resist patterns PM1 subjected to the heat treatment under a plurality of heating temperature conditions is treated by the solvent contained in the photoresist used in the second resist film formation process (S41) (as shown in FIG. 21).

For example, the resist solvent treatment is performed using the resist solvent described below according to a spin coat method (immersion time: 60 seconds).

resist solvent: mixed solvent of propylene glycol monomethyl ether of 70 wt % and propylene glycol monomethyl ether acetate of 30 wt %

In the developer treatment step (S402), each of a plurality of the first resist patterns PM1 subjected to the heat treatment under a plurality of heating temperature conditions is treated by the developer used in development in the second resist pattern formation process (S51).

For example, the developer treatment is performed using an alkali developer described below.

alkali developer: tetra methyl ammonium hydroxide (TMAH) aqueous solution of 2.38 wt %
development time: 60 seconds Next, as shown in FIG. 22, a pattern integrity check step is performed (S501).

Here, insolubility is observed for each of a plurality of first resist patterns PM1 subjected to the resist solvent treatment step (S401) and the developer treatment step (S402), and an insolubilization condition is set based on the corresponding observation results.

For example, electron beam microscope photographs are taken from each of the first resist patterns PM1, and the results of the insolubility are obtained by observing the photographs.

FIGS. 23 and 24 illustrate results of the pattern integrity check according to the fourth embodiment of the present invention.

FIG. 23 illustrates results of observing insolubility for the heat treatment temperature. In FIG. 23, the exposure amount of the re-exposure is set to a constant condition of 700 J/m$^2$. In addition, the results obtained without performing re-exposure are also shown in FIG. 23.

On the contrary, FIG. 24 illustrates results of observing insolubility for the exposure amount of re-exposure. In FIG. 24, a constant condition is set such that the heat treatment temperature is set to 180° C., and the heat treatment time is set to 120 seconds.

In FIGS. 23 and 24, the insolubility was determined based on the following determination criteria.

O: there is no variation in the shape of the resist pattern before and after the resist solvent treatment and the developer treatment step.

X: there is a variation in the shape of the resist pattern before and after the resist solvent treatment and the developer treatment step.

As shown in FIG. 23, when only the heat treatment is performed without performing the re-exposure, insolubilization may not be sufficiently realized for both the resist solvent and the alkali developer under any heating temperature condition. On the contrary, when re-exposure and heat treatment are performed at a temperature equal to or higher than 180° C., it is possible to give an insolubilization capability to both the alkali developer and the resist solvent.

In addition, as shown in FIG. 24, by setting the exposure amount to be equal to or larger than 600 J/m$^2$, it is possible to give an insolubilization capability to both the alkali developer and the resist solvent.

Therefore, a condition capable of preferably giving an insolubilization capability without a variation in the shape of the resist pattern is set as the insolubilization condition based on the results shown in FIGS. 23 and 24.

For example, as the insolubilization condition, the exposure amount of the re-exposure is set to 600 J/m$^2$, and the heating temperature of the heat treatment is set to 180° C.

Then, as shown in FIG. 21, in the insolubilization process subsequent to the insolubilization condition setting process (S10), insolubilization is performed under the corresponding insolubilization condition that has been set.

In addition, for the KrF chemical amplification positive resist, a preferable insolubilization condition at a film thickness of 1500 nm and the preferable insolubilization condition at a film thickness of 5000 nm were recognized as follows. Therefore, according to the present embodiment, it is possible preferably to obtain the aforementioned effects even when the first resist pattern PM1 has a thick film thickness equal to or larger than 500 nm and equal to or smaller than 5000 nm.

<insolubilization condition at a film thickness of 1500 nm>
exposure amount: 600 J/m$^2$
heating temperature: 160° C.
<insolubilization condition at a film thickness of 5000 nm>
exposure amount: 700 J/m$^2$
heating temperature: 180° C.

(B) Conclusion

As described above, according to the present embodiment, the insolubilization condition for the re-exposure and the heat treatment in the insolubilization process (S31) is set in the insolubilization condition setting process (S10). Then, under the insolubilization condition that has been set, insolubilization is performed in the insolubilization process (S31).

Accordingly, according to the present embodiment, since it is possible appropriately to perform insolubilization similar to the first embodiment, it is possible to improve manufacturing efficiency and readily realize cost reduction.

The present invention is not limited to the aforementioned embodiments, but various modifications may be employed.

According to the aforementioned embodiments, the first resist pattern PM1 corresponds to the first resist pattern of the present invention. In addition, according to the aforementioned embodiments, the second resist patterns PM2, PM2b, PM2c, PM2d, and PM2e correspond to the second resist pattern of the present invention. In addition, according to the aforementioned embodiments, the first resist film PR1 corresponds to the first resist film of the present invention. In addition, according to the aforementioned embodiments, the second resist films PR2 and PR2d correspond to the second resist film of the present invention.

The present application contains subject matter related to that disclosed in Japanese Priority Patent Application JP 2009-159905 filed in the Japan Patent Office on Jul. 6, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, comprising:
a first resist film formation process of forming a first resist film on a processing target surface using a positive-type photoresist material;
a first resist pattern formation process of forming a first resist pattern by performing development after exposure in which exposure light is irradiated onto the first resist film;
a second resist film formation process of forming a second resist film on the processing target surface, where the first resist pattern is formed, using a photoresist material; and
a second resist pattern formation process of forming a second resist pattern by performing exposure in which exposure light is irradiated onto the second resist film and then performing development,
wherein,
the method further includes, before the second resist film formation process, an insolubilization process for insolubilizing the first resist pattern against a developer used in development of the second resist film formation process and a solvent of a photoresist material used in the second resist pattern formation process, and
in the insolubilization process, insolubilization of the first resist pattern is performed by sequentially performing a re-exposure step of performing re-exposure in which light having the same wavelength as that of exposure light irradiated in the exposure of the first resist pattern formation process is irradiated onto the first resist pattern and a heat treatment step of performing heat treatment to heat the first resist pattern subjected to the re-exposure process.

2. The method of manufacturing a semiconductor device according to claim 1, etching or ion implantation is performed for the processing target film using the first and second resist patterns as a mask.

3. The method of manufacturing a semiconductor device according to claim 1, wherein in the second resist pattern formation process, the second resist pattern is formed such that at least a part of the second resist pattern is laminated on the first resist pattern.

4. The method of manufacturing a semiconductor device according to claim 3, further comprising:
an ion implantation process for implanting ions of impurities to the processing target surface using the first resist pattern as a mask before the second resist film formation process; and
an etching process for etching the processing target surface using the first and second resist patterns as a mask after the second resist pattern formation process.

5. The method of manufacturing a semiconductor device according to claim 4, wherein the ion implantation process is performed before the insolubilization process.

6. The method of manufacturing a semiconductor device according to claim 1, further comprising a resist pattern selective removal process in which a part of the first resist pattern subjected to the insolubilization remains, and other portions are removed,
wherein in the re-exposure step of the insolubilization process, re-exposure is performed for a part of the first resist pattern, and in the resist pattern selective removal process, a portion of the resist pattern subjected to the re-exposure remains, and a portion where the re-exposure is not performed is removed.

7. The method of manufacturing a semiconductor device according to claim 1, wherein:
in the first resist film formation process, the first resist film is formed using a chemical amplification resist material as the photoresist material, and
in the second resist film formation process, the second resist film is formed using a chemical amplification resist material as the photoresist material.

8. The method of manufacturing a semiconductor device according to claim 1, wherein in the re-exposure step of the insolubilization process, the re-exposure is performed with an exposure amount larger than that of the exposure of the first resist pattern formation process.

9. The method of manufacturing a semiconductor device according to claim 1, wherein:
in the first resist pattern formation process, heat treatment is performed for the first resist film after the exposure for the first resist film before the development, and
in the heat treatment step of the insolubilization process, the heat treatment is performed for the first resist pattern at a heating temperature higher than that of the heat treatment of the first resist pattern formation process.

10. The method of manufacturing a semiconductor device according to claim 1, wherein in the first and second resist pattern formation processes, the exposure is performed by irradiating light having a wavelength of 248 nm as the exposure light using KrF excimer laser.

11. The method of manufacturing a semiconductor device according to claim 1, wherein in the first and second resist film formation processes, each of the first and second resist films is formed such that a film thickness of each of the first and second resist films is equal to or larger than 500 nm and equal to or smaller than 5000 nm.

12. The method of manufacturing a semiconductor device according to claim 1, further comprising an insolubilization condition setting process in which an insolubilization condition is set for the heat treatment step and the re-exposure step in the insolubilization process,
wherein,
in the insolubilization process, insolubilization is performed based on the insolubilization condition set in the insolubilization condition setting process.

13. The method of manufacturing a semiconductor device according to claim 12, wherein the insolubilization condition setting process comprises:
performing the re-exposure step a plurality of times under a plurality of exposure amount conditions,
performing the heat treatment step a plurality of times under a plurality of heating temperature conditions,
a resist solvent treatment step of processing each of a plurality of the first resist patterns subjected to the heat treatment under a plurality of heating temperature conditions using a solvent contained in the photoresist material used in the second resist film formation process, and
performing a developer treatment step of processing each of a plurality of the first resist patterns subjected to the heat treatment under a plurality of heating temperature conditions using a developer used in development of the second resist pattern formation process,
wherein,
insolubility of each of a plurality of the first resist patterns subjected to the resist solvent treatment step and the developer treatment step are observed, and an insolubilization condition is set based on a result of the observation.

14. A pattern formation method comprising:
a first resist film formation process of forming a first resist film on a processing target surface using a positive-type photoresist material;
a first resist pattern formation process of forming a first resist pattern by performing exposure in which exposure light is irradiated onto the first resist film and then performing development;
a second resist film formation process of forming a second resist film on the processing target surface having the first resist pattern using a photoresist material; and
a second resist pattern formation process of forming a second resist pattern by performing exposure in which exposure light is irradiated onto the second resist film and then performing development,
wherein,
the pattern formation method further comprises an insolubilization process of insolubilizing the first resist pattern against a developer used in development of the second resist pattern formation process and a solvent of the photoresist material used in the second resist film formation process before the second resist film formation process, and
in the insolubilization process, insolubilization for the first resist pattern is performed by sequentially performing a re-exposure step of performing re-exposure in which light having the same wavelength as that of the exposure light irradiated in the exposure of the first resist pattern formation process is irradiated onto the first resist pattern and a heat treatment step of performing heat treatment to heat the first resist pattern subjected to the re-exposure.

* * * * *